United States Patent
Kogishi et al.

(10) Patent No.: US 7,595,663 B2
(45) Date of Patent: Sep. 29, 2009

(54) INTERFACE CIRCUIT

(75) Inventors: Toshiya Kogishi, Osaka (JP); Koji Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/882,343

(22) Filed: Aug. 1, 2007

(65) Prior Publication Data

US 2008/0036521 A1 Feb. 14, 2008

(30) Foreign Application Priority Data

Aug. 9, 2006 (JP) .............................. 2006-216816

(51) Int. Cl.
*H03K 19/0175* (2006.01)
(52) U.S. Cl. .......................................... 326/82; 326/86
(58) Field of Classification Search ............. 326/56–58, 326/62, 82–83, 86–87; 327/108, 109; 375/219, 375/220
See application file for complete search history.

(56) References Cited

U.S. PATENT DOCUMENTS

| | | | |
|---|---|---|---|
| 6,624,656 B1 * | 9/2003 | Fox et al. ....................... 326/41 |
| 6,707,325 B2 | 3/2004 | Taguchi et al. |
| 2005/0073198 A1 * | 4/2005 | Sakai et al. .................... 307/18 |
| 2006/0214684 A1 * | 9/2006 | Bando et al. ................... 326/57 |

OTHER PUBLICATIONS

"Stub Series Terminated Logic for 2.5 V (SSTL_2)", JEDEC Standard (JESD8-9B), May 2002, pp. 1-20, Arlington Virginia.
"Double Data Rate (DDR) SDRAM Specification", JEDEC Standard (JESD79D), Jan. 2004, pp. 1-78, USA.
"Double Data Rate (DDR) SDRAM Specification", JEDEC Standard (JESD89E), May 2005, pp. 1-78, USA.

* cited by examiner

*Primary Examiner*—James H. Cho
*Assistant Examiner*—Jany Tran
(74) *Attorney, Agent, or Firm*—McDermott Will & Emery LLP

(57) ABSTRACT

An interface circuit is provided for use in a semiconductor device which transmits and receives a signal to and from the outside. The interface circuit includes a signal input/output terminal for receiving a signal from the outside in a signal input mode and a signal from the semiconductor device in a signal output mode, an input buffer gate circuit having an input terminal connected to the signal input/output terminal and for outputting a signal received at the input terminal to the semiconductor device, and an input level control circuit for fixing a potential level at the input terminal of the input buffer gate circuit to a predetermined level in a signal no-supply mode and removing the fixation of the potential level in the signal output mode and in the signal input mode.

12 Claims, 11 Drawing Sheets

PRIOR ART   FIG.13
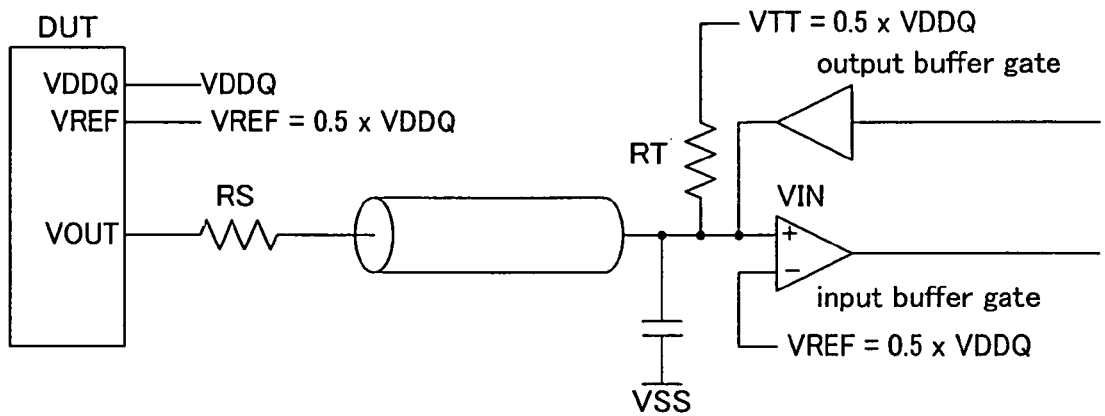
PRIOR ART   FIG.14
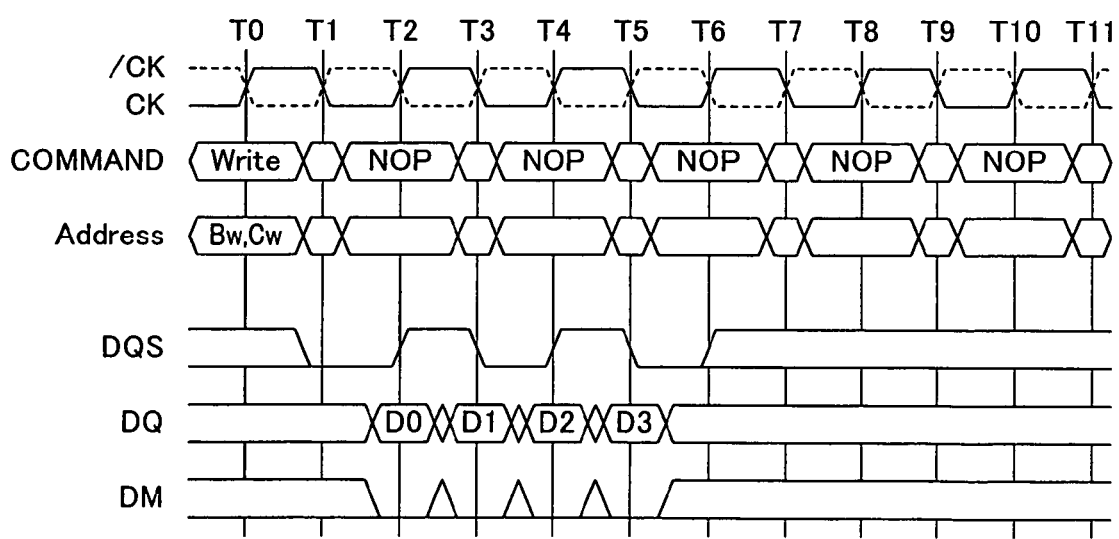

PRIOR ART FIG.15
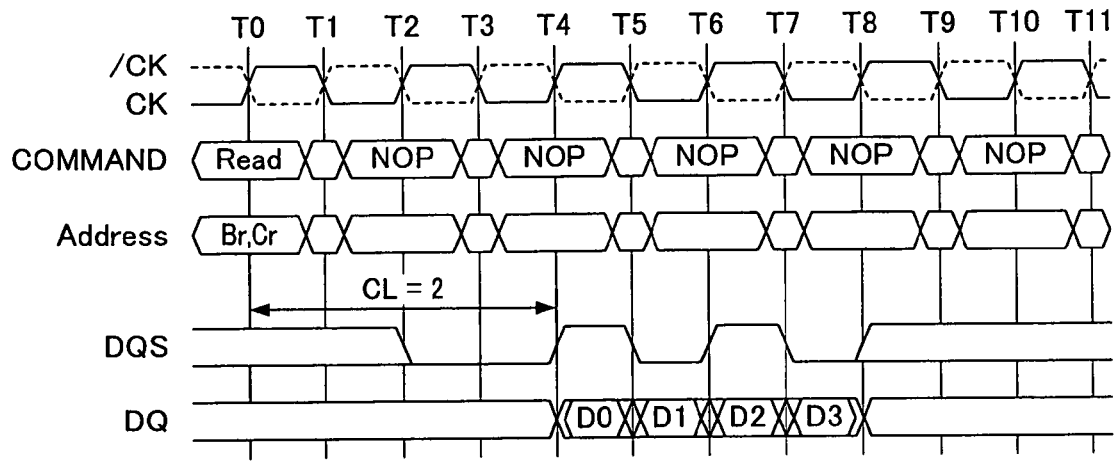
PRIOR ART FIG.16
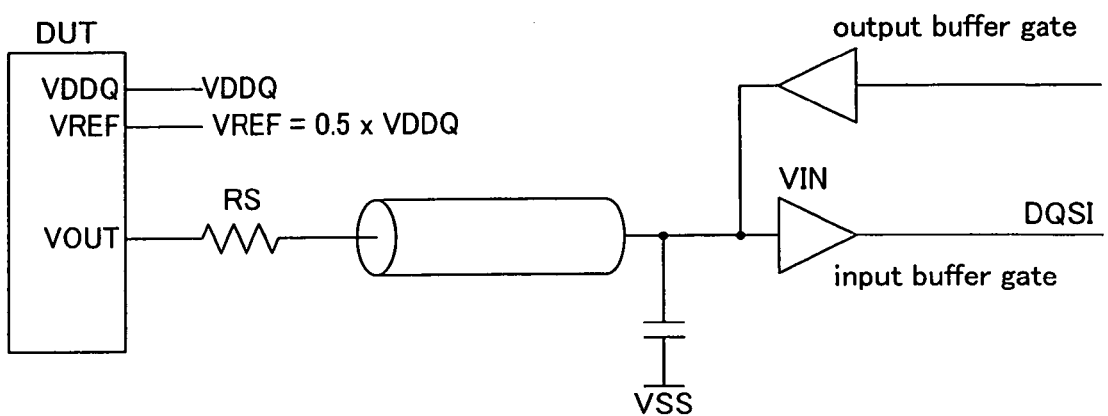

INTERFACE CIRCUIT

BACKGROUND OF THE INVENTION

1. Field of the Invention

The present invention relates to an interface circuit for use in a semiconductor device. More preferably, the present invention relates to a small-amplitude signal interface circuit, such as a Stub Series Terminated Logic (SSTL).

2. Description of the Related Art

In recent years, as the operating speed of semiconductor devices is increased, a technique of transferring data with high speed to an external interface, such as a DDR SDRAM (Double Data Rate SDRAM) or the like, using a small-amplitude signal interface (e.g., an SSTL) and an input/output synchronization signal, is more often used.

FIG. 13 shows an exemplary interface, SSTL_2, which is a kind of SSTL described in the Joint Electron Device Engineering Council (JEDEC) Standard No. 8-9B (JESD8-9B). The interface circuit is connected between an information processing section (not shown) of a semiconductor device which is a VIN-side device and an external device (e.g., a DDR SDRAM) which is a VOUT-side device. The VOUT-side device is connected via a series resistor RS to a transmission channel. The VIN-side device comprises an input buffer gate, an output buffer gate, and a terminal resistor RT. One end of the terminal resistor RT is connected to the transmission channel, while the other end is connected to a voltage VTT (i.e., ½ of a supply voltage VDDQ).

When the VOUT-side device outputs a "1" level which is equal to the supply voltage VDDQ or a "0" level which is equal to a ground VSS, a "1" level which is lower than the supply voltage VDDQ or a "0" level which is higher than the ground VSS is supplied to the VIN-side input buffer gate due to the series resistor RS and the terminal resistor RT. In other words, a small-amplitude signal is supplied. Therefore, a differential amplification circuit including a current mirror load is widely used for the VIN-side input buffer gate.

The input buffer gate formed of the differential amplification circuit receives a small-amplitude signal VIN supplied to the VIN-side device. In the input buffer gate, the magnitude of the small-amplitude signal VIN is compared with the magnitude of a voltage VREF (i.e., ½ of the supply voltage VDDQ) to determine a "1/0" level.

In the differential amplification circuit, a through current flows all the time when it is in the active state. Therefore, power consumption is larger than that of input buffer gates formed of a Complementary MOS (CMOS) circuit, but can input a small-amplitude signal with high speed. Also, when the VOUT-side device does not output the "1/0" level (i.e., a high-impedance state (Hi-Z state)), the voltage of the transmission channel is settled to VDDQ×½ due to the terminal resistor RT.

On the other hand, a means for transmitting and receiving data to and from a DDR SDRAM or the like with high speed using an input/output synchronization signal is used. In this technique, when data is input or output, a sender-side device (e.g., a semiconductor device) supplies data in synchronization with an edge of an input/output synchronization signal DQS, while a receiver-side device (e.g., a DDR SDRAM) receives data in synchronization with an edge of a supplied input/output synchronization signal. Thereby, variations in delay between the data and the input/output synchronization signal are reduced, so that the data can be easily synchronized with the input/output synchronization signal irrespective of the distance between the sender and the receiver.

FIG. 14 is an exemplary timing chart of a write operation to a DDR SDRAM which is described in JEDEC Standard No.79D (JESD79D). In FIG. 14, "CK" indicates a clock, "/CK" indicates an inverted clock, and "COMMAND" collectively indicates commands, "Address" collectively indicates banks and addresses, "DQS" indicates an input/output synchronization signal, "DQ" indicates a data signal, and "DM" indicates a write data mask permission signal. When a write operation is performed with respect to the DDR SDRAM, the input/output synchronization signal DQS and the data signal DQ are output from the semiconductor device.

In cycle T0, the semiconductor device outputs a write command (Write), a write bank (Bw), and a write address (Cw).

Near cycle T1, the semiconductor device causes the input/output synchronization signal DQS to go to the "0" level. At some point in cycle T1, the semiconductor device outputs first write data D0 as the data signal DQ. Here, an interval from when the input/output synchronization signal DQS first goes to the "0" level to when the input/output synchronization signal DQS goes to the "1" level is referred to as a preamble.

At the beginning of cycle T2, the semiconductor device causes the input/output synchronization signal DQS to go from the "0" level to the "1" level, and the DDR SDRAM receives the write data D0 in synchronization with this timing. At some point in cycle T2, the semiconductor device outputs second write data D1 as the data signal DQ. At the beginning of cycle T3, the semiconductor device causes the input/output synchronization signal DQS to go from the "1" level to the "0" level, and the DDR SDRAM receives the write data D1 in synchronization with this timing.

Thus, the semiconductor device switches the "1/0" level of the input/output synchronization signal DQS every clock cycle and outputs the data signal DQ in synchronization with a rising edge and a falling edge of the input/output synchronization signal DQS and at some point therebetween.

When a predetermined number of data signals DQ (in FIG. 14, four pieces of write data D0, D1, D2 and D3) have been output, the semiconductor device suspends outputting of the input/output synchronization signal DQS in the next cycle T6 (i.e., the output of the input/output synchronization signal DQS is caused to go to a "Hi-Z state"). Here, an interval from when the input/output synchronization signal DQS most recently goes to the "0" level to when the input/output synchronization signal DQS goes to the "Hi-Z state" is referred to as a postamble.

FIG. 15 is an exemplary timing chart of a read operation from a DDR SDRAM described in the JEDEC Standard No.79D (JESD79D). In FIG. 15, "CK" indicates a clock, "/CK" indicates an inverted clock, "COMMAND" collectively indicates commands, "Address" collectively indicates banks and addresses, "DQS" indicates an input/output synchronization signal, and "DQ" indicates a data signal. During the read operation from the DDR SDRAM, the input/output synchronization signal DQS and the data signal DQ are output from the DDR SDRAM. Note that, here, a latency (a delay (in clock cycles) from when the DDR SDRAM receives a command to when the DDR SDRAM outputs data) is assumed to be "two cycles (CL=2)".

In cycle T0, the semiconductor device outputs a read command (Read), a read bank (Br), and a read address (Cr).

Near cycle T2 (one cycle before the latency), the DDR SDRAM causes the input/output synchronization signal DQS to go to the "0" level. Here, an interval from when the input/output synchronization signal DQS first goes to the "0" level to when the input/output synchronization signal DQS goes to the "1" level is referred to as a preamble.

At the beginning of cycle T4 (after the latency), the DDR SDRAM causes the input/output synchronization signal DQS to go to the "1" level, and at the same time, outputs first read data D0 as the data signal DQ. At the beginning of cycle T5, the DDR SDRAM causes the input/output synchronization signal DQS to go to the "0" level, and at the same time, outputs second read data D1 as the data signal DQ.

Thus, the DDR SDRAM switches the "1/0" level of the input/output synchronization signal DQS every clock cycle and outputs the data signal DQ in synchronization with a rising edge and a falling edge of the input/output synchronization signal DQS.

When a predetermined number of data signals DQ (in FIG. 15, the four pieces of read data D0, D1, D2 and D3) have been output, the DDR SDRAM suspends outputting of the input/output synchronization signal DQS in the next cycle T8 (i.e., the output of the input/output synchronization signal DQS is caused to go to the "Hi-Z state"). Also, the DDR SDRAM causes the input/output synchronization signal DQS to go to the "Hi-Z state", and at the same time, also causes the data signal DQ to go to the "Hi-Z state". Here, an interval from when the input/output synchronization signal DQS most recently goes to the "0" level to when the input/output synchronization signal DQS goes to the "Hi-Z state" is referred to as a postamble.

Since the input/output synchronization signal DQS and the data DQ are transferred with high speed, a small-amplitude signal interface, such as an SSTL or the like, is typically provided for the semiconductor device and the DDR SDRAM. Also, the input/output synchronization signal DQS and the data DQ are both a bidirectional signal which can be output by both the semiconductor device and the DDR SDRAM. When none of the semiconductor device and the DDR SDRAM outputs the input/output synchronization signal DQS, the input/output synchronization signal DQS is in the "Hi-Z state". Similarly, when none of the semiconductor device and the DDR SDRAM outputs the data signal DQ, the data signal DQ is in the "Hi-Z state". Assuming that the interface is formed of an SSTL as shown in FIG. 13, when the input/output synchronization signal DQS goes to the "Hi-Z state", a potential at the input of the input buffer gate is settled to "VDDQ×½" due to the terminal resistor RT.

In the SSTL_2 interface of FIG. 13, a differential amplification circuit is expected to be used as the input buffer gate. Differential amplification circuits can receive a small-amplitude signal with high speed, though a through current flows all the time in the active state, resulting in large power consumption. Also, in the SSTL_2 interface, a reference voltage VREF is required to determine the "1/0" level of the small-amplitude signal in addition to the supply voltage VDDQ. Further, differential amplification circuits are an analog circuit, so that a relatively large mounting area is required.

To solve these problems, it is contemplated that an input buffer gate (e.g., an input buffer gate formed of a CMOS circuit) other than differential amplification circuits is used. However, in the interface of FIG. 13, when the input/output synchronization signal DQS is in the "Hi-Z state", the potential at the input of the input buffer gate is "VDDQ×½", so that a through current flows through the input buffer gate. In CMOS circuits, when a through current continues to flow, a deterioration or a destruction occurs in the circuit. Therefore, it is not easy to replace the input buffer gate formed of a differential amplification circuit with an input buffer gate formed of a CMOS circuit.

Therefore, when an input buffer gate formed of a CMOS circuit is used, the terminal resistor RT needs to be eliminated from the interface circuit. With such a configuration, when a bidirectional signal (i.e., the input/output synchronization signal DQS and the data signal DQ) is not output from any of the semiconductor device and the DDR SDRAM, the potential of the transmission channel (i.e., the potential at the input/output terminal of the VOUT-side device and the potential at the input of the VIN-side input buffer gate) are not settled (i.e., "Hi-Z state"), so that the potential level is considerably unstable. In this case, the potential of the transmission channel easily varies due to noise or the like, so that the input buffer gate erroneously recognizes the potential variation due to noise as a change in the "1/0" level. In particular, since the input/output synchronization signal DQS controls reception of the data DQ using a rising edge and a falling edge thereof, if the "1/0" level of the input/output synchronization signal DQS is erroneously recognized in the input buffer gate, the data DQ cannot be received with correct timing, leading to an erroneous operation.

FIG. 16 shows an exemplary configuration of another interface circuit. This interface circuit has a configuration similar to that of FIG. 13, except that the terminal resistor RT of FIG. 13 is eliminated and an input buffer gate which is formed of a CMOS circuit is provided instead of the input buffer gate formed of a differential amplification circuit. The other parts are similar to those of FIG. 13.

FIG. 17 shows an exemplary timing chart of a read operation from a DDR SDRAM when the interface circuit of FIG. 16 is used. In FIG. 17, "CK" indicates a clock, "/CK" indicates an inverted clock, "COMMAND" collectively indicates commands, "Address" collectively indicates banks and addresses, "DQS" indicates an input/output synchronization signal, "DQSI" indicates a DQS input which is supplied from the interface circuit to the semiconductor device, and "DQ" indicates a data signal. When a read operation from the DDR SDRAM is performed, the input/output synchronization signal DQS and the data signal DQ are output from the semiconductor device. Note that it is here assumed that the latency is "two cycles".

In cycle T0, the semiconductor device outputs a read command (Read), a read bank (Br), and a read address (Cr).

Near cycle T2 (one cycle before the latency), the DDR SDRAM causes the input/output synchronization signal DQS to go to the "0" level. Here, since the input/output synchronization signal DQS is in the "Hi-Z state" in cycles before cycle T2, the potential easily varies due to noise or the like. For example, if the level of the input/output synchronization signal DQS varies in cycle T1, a change in the "1/0" level occurs in the DQS input DQSI which is supplied via the interface circuit to the semiconductor device. In this case, the semiconductor device erroneously receives the data signal DQ in synchronization with this variation.

Thus, when an input buffer gate in a small-amplitude signal interface (e.g., an SSTL) is formed of a circuit other than differential amplification circuits, various problems arise, including circuit destruction due to a through current, an erroneous operation due to erroneous recognition of the "1/0" level, and the like.

SUMMARY OF THE INVENTION

The present invention is provided to solve these problems. An object of the present invention is to provide an interface circuit capable of preventing a semiconductor device from erroneous recognizing a signal level. Another object of the present invention is to provide an interface in which an input buffer gate can be formed of a circuit other than differential amplification circuits.

According to one aspect of the present invention, an interface circuit is provided for use in a semiconductor device having a signal output mode in which a signal is supplied to the outside, a signal input mode in which a signal is received from the outside, and a signal no-supply mode in which a signal is not supplied from the outside and a signal is not supplied to the outside. The interface circuit comprises a signal input/output terminal for receiving a signal from the outside in the signal input mode and a signal from the semiconductor device in the signal output mode, an input buffer gate circuit having an input terminal connected to the signal input/output terminal and for outputting a signal received at the input terminal to the semiconductor device, and an input level control circuit for fixing a potential level at the input terminal of the input buffer gate circuit to a predetermined level in the signal no-supply mode and removing the fixation of the potential level in the signal output mode and in the signal input mode.

In the interface circuit, when a signal is not supplied from any of the semiconductor device and the outside (e.g., an external device), the potential level at the input of the input buffer gate circuit is fixed. Therefore, it is possible to prevent the potential level at the input of the input buffer gate circuit from varying due to noise or the like, thereby making it possible to prevent the semiconductor device from erroneously recognizing the signal level. Also, when a signal is supplied from either the semiconductor device or the outside, the fixation of the potential level at the input of the input buffer gate circuit is removed, so that signal propagation is not hindered. Further, as is different from the conventional art, it is not necessary to use a reference voltage so as to determine the signal level, so that a through current does not flow through the input buffer gate circuit. Therefore, it is not necessary to use a differential amplification circuit as the input buffer gate circuit (i.e., the input buffer gate circuit can be formed of a circuit other than differential amplification circuits). Thereby, power consumption can be reduced, thereby making it possible to reduce the circuit scale.

Preferably, the input level control circuit includes a resistance circuit having an ON state in which a potential level of the signal input/output terminal is pulled up or down and an OFF state in which the potential level of the signal input/output terminal is not pulled up or down, and a resistance control circuit for causing the resistance circuit to go to the ON state in the signal no-supply mode and the OFF state in the signal output mode and in the signal input mode.

In the interface circuit, by the resistance circuit going to the ON state, the potential level of the signal input/output terminal is fixed. Also, by the resistance circuit going to the OFF state, the fixation of the potential level of the signal input/output terminal is removed.

Also, preferably, the interface circuit further comprises an output buffer gate circuit having an input terminal and an output terminal, the output terminal being connected to the signal input/output terminal, and having a signal output state in which a signal received at the input terminal is output, and a high-impedance state in which, even when a signal is received at the input terminal, the signal is not output, and an output control circuit for causing the output buffer gate circuit to go to the signal output state in the signal output mode and in the signal no-supply mode, and the high-impedance state in the signal input mode. The input level control circuit includes a level control circuit for outputting a first level signal in the signal output mode and a second level signal in the signal no-supply mode, and a logic circuit connected between the semiconductor device and the input terminal of the output buffer gate circuit and for outputting a signal having a predetermined potential level to the output buffer gate circuit when the first level signal is output from the level control circuit and a signal from the semiconductor device to the output buffer gate circuit when the second level signal is output from the level control circuit.

In the interface circuit, when a signal is not supplied from any of the semiconductor device and the outside (e.g., an external device), the output buffer gate circuit outputs a signal having a predetermined level, so that the potential level of the signal input/output terminal is fixed to a predetermined level. Also, when a signal is supplied from the semiconductor device, the output buffer gate circuit outputs the signal from the semiconductor device, so that the fixation of the potential level of the signal input/output terminal is removed, and the signal from the semiconductor device is supplied to the external device. Further, when a signal is supplied from the external device, the output buffer gate circuit is in the high-impedance state, so that the fixation of the potential level of the signal input/output terminal is removed, and the signal from the external device is supplied via the input buffer gate circuit to the semiconductor device.

Also, preferably, the input level control circuit includes a resistance circuit having an ON state in which a potential level of the signal input/output terminal is pulled up or down and an OFF state in which the potential level of the signal input/output terminal is not pulled up or down, and a resistance control circuit for causing the resistance circuit to go to the ON state in the signal no-supply mode and the OFF state in the signal output mode, and detects a potential level at the input terminal of the input buffer gate circuit and, depending on a result of the detection of the potential level, causing the resistance circuit to go to the OFF state in the signal input mode.

In the interface circuit, the resistance control circuit, when detecting start of signal propagation (preamble), causes the resistance circuit to go to the OFF state.

According to another aspect of the present invention, an interface circuit is provided for use in a semiconductor device having a signal output mode in which a signal is supplied to the outside, a signal input mode in which a signal is received from the outside, and a signal no-supply mode in which a signal is not supplied from the outside and a signal is not supplied to the outside. The interface circuit comprises a signal input/output terminal for receiving a signal from the outside in the signal input mode and a signal from the semiconductor device in the signal output mode, an input buffer gate circuit having an input terminal connected to the signal input/output terminal and for outputting a signal received at the input terminal to the semiconductor device, and an output level control circuit for fixing a potential level at the output terminal of the input buffer gate circuit to a predetermined level in the signal no-supply mode and removing the fixation of the potential level in the signal input mode.

In the interface circuit, when a signal is not supplied from any of the semiconductor device and the external (e.g., an external device), the potential level at the output of the input buffer gate circuit is fixed. Therefore, it is possible to prevent an erroneously detected signal from being supplied to the semiconductor device, thereby making it possible to prevent the semiconductor device from erroneously recognize the signal level. Also, when a signal is supplied from the outside to the semiconductor device, the fixation of the potential level of the input buffer gate circuit is removed, so that signal propagation is not hindered. Further, as is different from the conventional art, it is not necessary to use a reference voltage so as to determine the signal level, so that a through current does not flow through the input buffer gate circuit. Therefore, it is not necessary to use a differential amplification circuit as the input buffer gate circuit (i.e., the input buffer gate circuit can be formed of a circuit other than differential amplification circuits). Thereby, power consumption can be reduced, thereby making it possible to reduce the circuit scale.

Preferably, the output level control circuit includes a level control circuit for outputting a first level signal in the signal no-supply mode and a second level signal in the signal input mode, and a logic circuit connected between the output terminal of the input buffer gate circuit and the semiconductor device and for outputting to the semiconductor device a signal having a predetermined potential level when the level control circuit outputs the first level signal and an output of the input buffer gate circuit when the level control circuit outputs the second level signal.

In the interface circuit, when a signal is not supplied from any of the semiconductor device and the external (e.g., an external device), a signal having a predetermined level is supplied to the semiconductor device, but not the output of the input buffer gate circuit, so that the potential level at the output of the input buffer gate circuit is fixed to a predetermined level. Also, when a signal is supplied from the outside to the semiconductor device, the output of the input buffer gate circuit is supplied to the semiconductor device, so that signal propagation is not hindered.

BRIEF DESCRIPTION OF THE DRAWINGS

FIG. 13 is a diagram showing a configuration of a conventional interface circuit.

FIG. 14 is a timing chart for describing an operation of the interface circuit of FIG. 13 during a write process from a semiconductor device to an external device in the conventional art.

FIG. 15 is a timing chart for describing an operation of the interface circuit of FIG. 13 during a read process from an external device to a semiconductor device in the conventional art.

FIG. 16 is a diagram showing a configuration of a conventional interface circuit in which a CMOS circuit is used instead of an input buffer and a terminal resistor is eliminated.

DETAILED DESCRIPTION OF THE PREFERRED EMBODIMENTS

Figure 1:
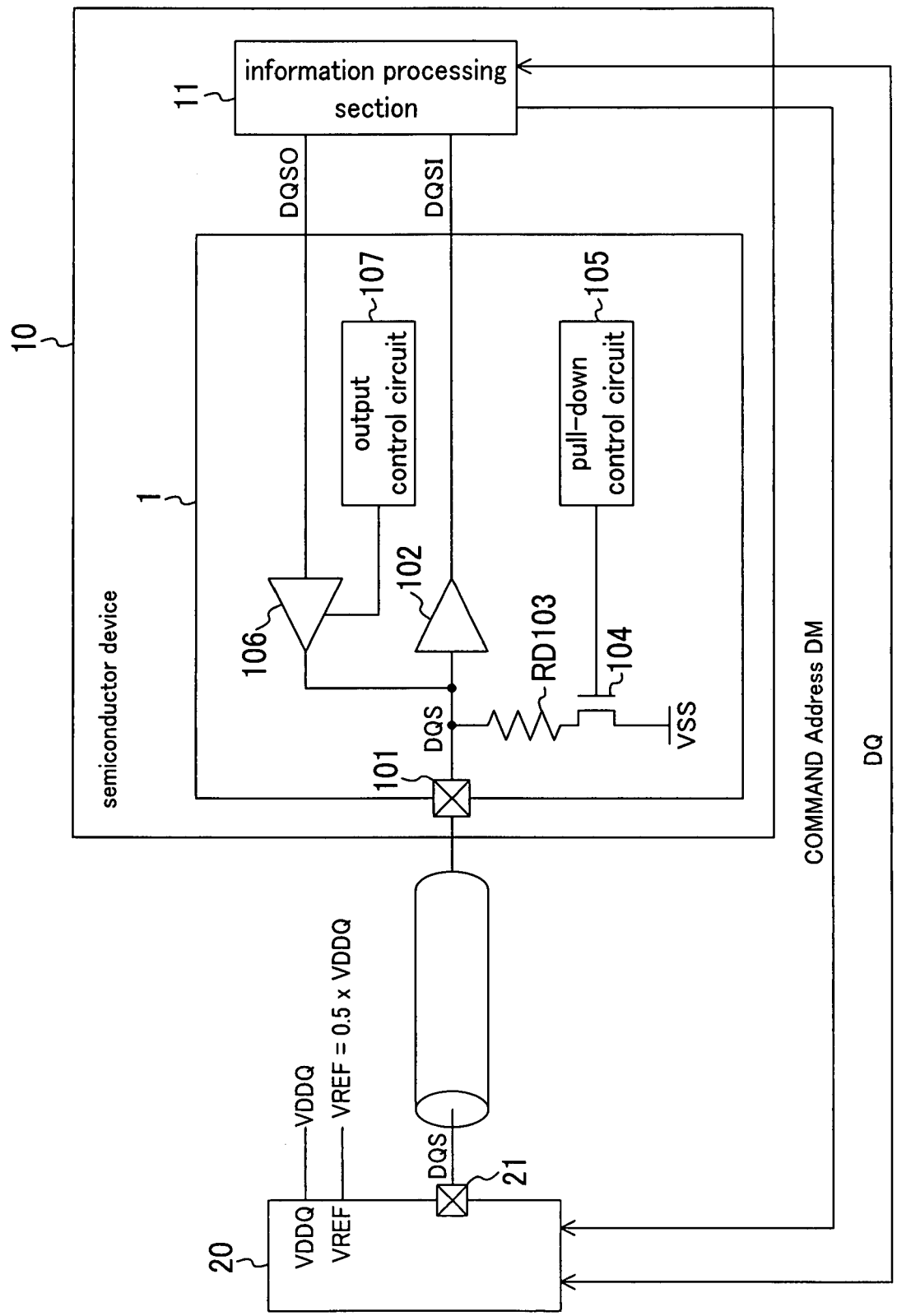
FIG. 1 is a diagram showing a configuration of an interface circuit according to a first embodiment of the present invention.

Hereinafter, embodiments of the present invention will be described with reference to the accompanying drawings. Note that the same or corresponding parts are indicated by the same reference numerals and will not be repeatedly described.

First Embodiment

<Configuration>

FIG. 1 shows an interface circuit 1 according to a first embodiment of the present invention. The interface circuit 1 is an interface included in a semiconductor device 10 and is interposed between an external device 20 and an information processing section 11 which is included in the semiconductor device 10. Here, the external device 20 is a DDR SDRAM (Double Data Rate SDRAM) and has a small-amplitude signal interface (e.g., an SSTL_2 interface). The information processing section 11 transmits and receives an input/output synchronization signal DQS to and from the external device 20 via the interface circuit 1. The information processing section 11 also transmits and receives various signals (a command COMMAND, an address Address, a data signal DQ, and a data mask signal DM) to and from the external device 20.

The interface circuit 1 comprises an input/output synchronization signal terminal 101, an input buffer gate 102, a pull-down resistor RD103, a switch element (transistor) 104, a pull-down control circuit 105, an output buffer gate 106, and an output control circuit 107.

The input/output synchronization signal terminal 101 is connected to an input/output synchronization signal terminal 21 of the external device 20, and receives the input/output synchronization signal DQS from the external device 20.

The input buffer gate 102 has an input terminal connected to the input/output synchronization signal terminal 101. The input buffer gate 102 receives the input/output synchronization signal DQS from the input/output synchronization signal terminal 101, and outputs the signal DQS as a DQS input DQSI to the information processing section 11.

The pull-down resistor RD103 and the switch element 104 are connected in series between the input/output synchronization signal terminal 101 and a ground potential VSS.

The pull-down control circuit 105 controls ON/OFF of the switch element 104 to switch ON/OFF of pull-down.

The output buffer gate 106 has an output terminal connected to the input/output synchronization signal terminal 101 and an input terminal which receives a DQS output DQSO from the information processing section 11. The output buffer gate 106 can switch output states, i.e., a "signal output state" in which a signal received at the input terminal is output from the output terminal and a "high-impedance state (Hi-Z state)" in which a signal is not output even when a signal is received at the input terminal.

The output control circuit 107 controls an output state of the output buffer gate 106.

<Operation During Write Process>

Figure 2:
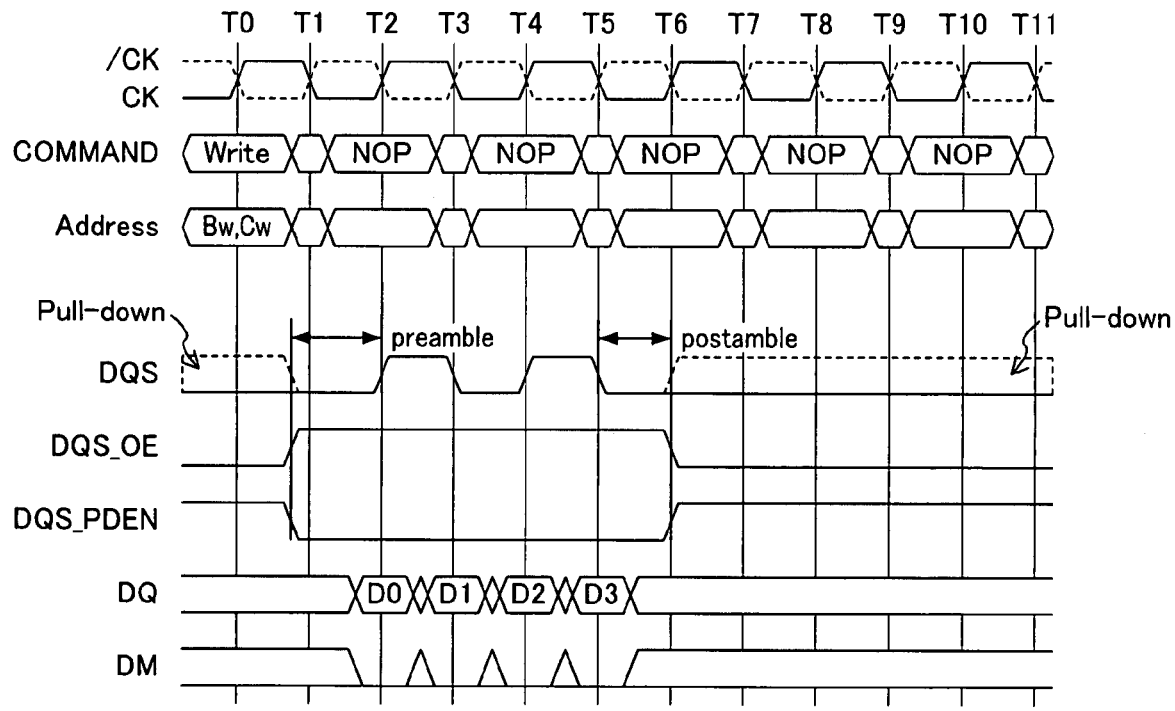
FIG. 2 is a timing chart for describing an operation of the interface circuit during a write process from a semiconductor device to an external device of FIG. 1.

Next, an operation of the interface circuit 1 when data is written from the semiconductor device 10 to the external device 20 of FIG. 1 will be described with reference to FIG. 2. In FIG. 2, "CK" indicates a clock, "/CK" indicates an inverted clock, "COMMAND" collectively indicates commands which are transmitted from the information processing section 11 to the external device 20, "Address" collectively indicates banks and addresses which are transmitted from the information processing section 11 to the external device 20, "DQS" indicates an input/output synchronization signal which is supplied from the output buffer gate 106 to the input/output synchronization signal terminal 101, "DQS_OE" indicates an output of the output control circuit 107, and "DQS_PDEN" indicates an output of the pull-down control circuit 105. Also, "DQ" indicates a data signal which is transmitted from the information processing section 11 to the external device 20, and "DM" indicates a write data mask permission signal which is transmitted from the information processing section 11 to the external device 20.

Before cycle T0, since the output DQS_OE of the output control circuit 107 is at the "0" level, the output state of the output buffer gate 106 is in the "Hi-Z state". Also, since the output DQS_PDEN of the pull-down control circuit 105 is at the "1" level, the input/output synchronization signal terminal 101 is connected via the pull-down resistor RD103 to the ground potential VSS (pull-down is ON). Thereby, potential levels at the inputs of the input/output synchronization signal terminal 101 and the input buffer gate 102 are fixed to the "0" level.

In cycle T0, the information processing section 11 outputs a write command "Write", a write bank "Bw", and a write address "Cw" to the external device 20.

Near cycle T1, the information processing section 11 causes the DQS output DQSO to go to the "0" level (starts supplying the DQS output DQSO). Also, the output control circuit 107 causes its own output DQS_OE to go to the "1" level and thereby causes the output state of the output buffer gate 106 to go to the "signal output state". Thereby, the output buffer gate 106 outputs the input/output synchronization signal DQS having the "0" level. Also, at the same time, the pull-down control circuit 105 causes its own output DQS_PDEN to go to the "0" level, thereby turning pull-down OFF (i.e., turning the switch element 104 OFF). Thereby, the level fixation at the input/output synchronization signal terminal 101 is removed, so that the output (input/output synchronization signal DQS) of the output buffer gate 106 is supplied via the input/output synchronization signal terminal 101 to the external device 20 (supply of the input/output synchronization signal DQS is started).

At some point in cycle T1, the information processing section 11 outputs first write data D0 as the data signal DQ to the external device 20.

At the beginning of cycle T2, the information processing section 11 causes the DQS output DQSO to go to the "1" level. Thereby, the output (input/output synchronization signal DQS) of the output buffer gate 106 goes from the "0" level to the "1" level. The external device 20 receives the first write data D0 from the information processing section 11 in synchronization with a rising edge of the input/output synchronization signal DQS. Here, an interval from when the input/output synchronization signal DQS first goes to the "0" level (outputting of the input/output synchronization signal DQS is started) to when the input/output synchronization signal DQS goes to the "1" level is referred to as a preamble.

At some point in cycle T2, the information processing section 11 outputs second write data D1 as the data signal DQ. At the beginning of cycle T3, the information processing section 11 causes the DQS output DQSO to go to the "0" level. Thereby, the output (the input/output synchronization signal DQS) of the output buffer gate 106 goes from the "1" level to the "0" level. The external device 20 receives the second write data D1 from the information processing section 11 in synchronization with a falling edge of the input/output synchronization signal DQS.

In cycles T4 and T5, processes similar to those of cycles T2 and T3 are executed, so that the information processing section 11 switches the potential levels of the DQS output DQSO, and outputs write data D2 and D3. The external device 20 receives the write data D2 and D3 from the information processing section 11 in synchronization with rising edges and falling edges of the input/output synchronization signal DQS.

Thus, the information processing section 11 sequentially outputs a predetermined number of pieces of write data (in FIG. 2, four) every clock cycle defined by the clock "CK" and the inverted clock "/CK", and switches the potential levels of the DQS output DQSO (alternatively outputs the "0" level and the "1" level). The external device 20 sequentially receives the data signal DQ from the information processing section 11 in synchronization with rising edges and falling edges of the input/output synchronization signal DQS. When the predetermined number of pieces of write data have been received by the external device 20, the write operation of the semiconductor device 10 is ended.

At the beginning of cycle T6, the information processing section 11 ends outputting of the DQS output DQSO, so that supply of the input/output synchronization signal DQS is ended. Here, an interval from when the input/output synchronization signal DQS most recently goes to the "0" level to when the input/output synchronization signal DQS goes to the high-impedance state (supply of the input/output synchronization signal DQS is ended) is referred to as a postamble. The output control circuit 107 causes its own output DQS_OE to go to the "0" level and thereby causes the output state of the output buffer gate 106 to go to the "Hi-Z state". Also, the pull-down control circuit 105 causes its own output DQS_PDEN to go to the "1" level and thereby turns pull-down ON (turns the switch element 104 0N). Thereby, the potential levels at the inputs of the input/output synchronization signal terminal 101 and the input buffer gate 102 are fixed to the "0" level.

After cycle T6, pull-down remains ON, so that the input of the input buffer gate 102 is fixed to the "0" level.

<Operation During Read Process>

Next, an operation of the interface circuit 1 when data is read from the external device 20 to the semiconductor device 10 of FIG. 1 will be described with reference to FIG. 3. Note that, in FIG. 3 (read process), "DQS" indicates an input/output synchronization signal which is supplied from the external device 20 to the input/output synchronization signal terminal 101, and "DQ" indicates a data signal from the external device 20 to the semiconductor device 10. Here, the output DQS_OE of the output control circuit 107 remains at the "0" level. Note that the latency is assumed to be "two cycles (CL=2)".

Before cycle T0, since the output DQS_OE of the output control circuit 107 is at the "0" level, the output state of the output buffer gate 106 is in the "Hi-Z state". Also, since the output DQS_PDEN of the pull-down control circuit 105 is at the "1" level, pull-down is ON. Thereby, the potential levels at the inputs of the input/output synchronization signal terminal 101 and the input buffer gate 102 are fixed to the "0" level.

In cycle T0, the information processing section 11 outputs a read command (Read), a read bank (Br), and a read address (Cr) to the external device 20.

Near cycle T2 (one cycle before the latency), the external device 20 causes the input/output synchronization signal DQS to go to the "0" level (supply of the input/output synchronization signal DQS is started). On the other hand, in the semiconductor device 10, since pull-down is ON and the input of the input buffer gate 102 is fixed to the "0" level, the input of the input buffer gate 102 does not vary.

In cycle T3 (preamble period), the pull-down control circuit 105 causes its own output DQS_PDEN to go to the "0" level and thereby turns pull-down OFF. Thereby, the level fixation at the inputs of the input/output synchronization signal terminal 101 and the input buffer gate 102 is removed, so that the input/output synchronization signal DQS from the external device 20 is supplied to the input buffer gate 102.

At the beginning of cycle T4 (after the latency), the external device 20 causes the input/output synchronization signal DQS to go from the "0" level to the "1" level, and at the same time, outputs first read data D0 in synchronization with the rising edge of the input/output synchronization signal DQS. On the other hand, the information processing section 11 of the semiconductor device 10 receives the first read data D0 in synchronization with the rising edge of the input/output synchronization signal DQS (the DQS input DQSI from the input buffer gate 102). Here, an interval from when the external device 20 first causes the input/output synchronization signal DQS to go to the "0" level (supply of the input/output synchronization signal DQS is started) to when the external device 20 causes the input/output synchronization signal DQS to go to the "1" level is referred to as a preamble.

At the beginning of cycle T5, the external device 20 causes the input/output synchronization signal DQS to go from the "1" level to the "0" level, and at the same time, outputs second read data D1 in synchronization with the falling edge of the input/output synchronization signal DQS. On the other hand, the information processing section 11 of the semiconductor device 10 receives the second read data D1 in synchronization with the falling edge of the input/output synchronization signal DQS (the DQS input DQSI from the input buffer gate 102).

In cycles T6 and T7, processes similar to those of cycles T4 and T5 are executed. Specifically, the external device 20 switches the potential levels of the input/output synchronization signal DQS and outputs read data D2 and D3 in synchronization with a rising edge and a falling edge of the input/output synchronization signal DQS. The information processing section 11 of the semiconductor device 10 receives the read data D2 and D3 from the external device 20 in synchronization with the rising edge and the falling edge of the input/output synchronization signal DQS.

Thus, the external device 20 switches the potential levels of the input/output synchronization signal DQS every clock cycle which is defined by the clock "CK" and the inverted clock "/CK", and sequentially outputs a predetermined number of pieces of read data DQ (here, four) in synchronization with rising edges and falling edges of the input/output synchronization signal DQS. Also, the information processing section 11 sequentially receives the read data signal DQ in synchronization with rising edges and falling edges of the input/output synchronization signal DQS. When the information processing section 11 have received the predetermined number of pieces of read data, the read operation of the semiconductor device 10 is ended.

At the beginning of cycle T8, the external device 20 ends supply of the input/output synchronization signal DQS. Here, an interval from when the input/output synchronization signal DQS most recently goes to the "0" level to when the input/output synchronization signal DQS goes to the high-impedance state (supply of the input/output synchronization signal DQS is ended) is referred to as a postamble. The pull-down control circuit 105 causes its own output DQS_PDEN to go to the "1" level and thereby turns pull-down ON. Thereby, the potential levels at the inputs of the input/output synchronization signal terminal 101 and the input buffer gate 102 are fixed to the "0" level.

After cycle T8, since pull-down remains ON, the input of the input buffer gate 102 is fixed to the "0" level.

<Timing of Switching Pull-down>

Figure 3:
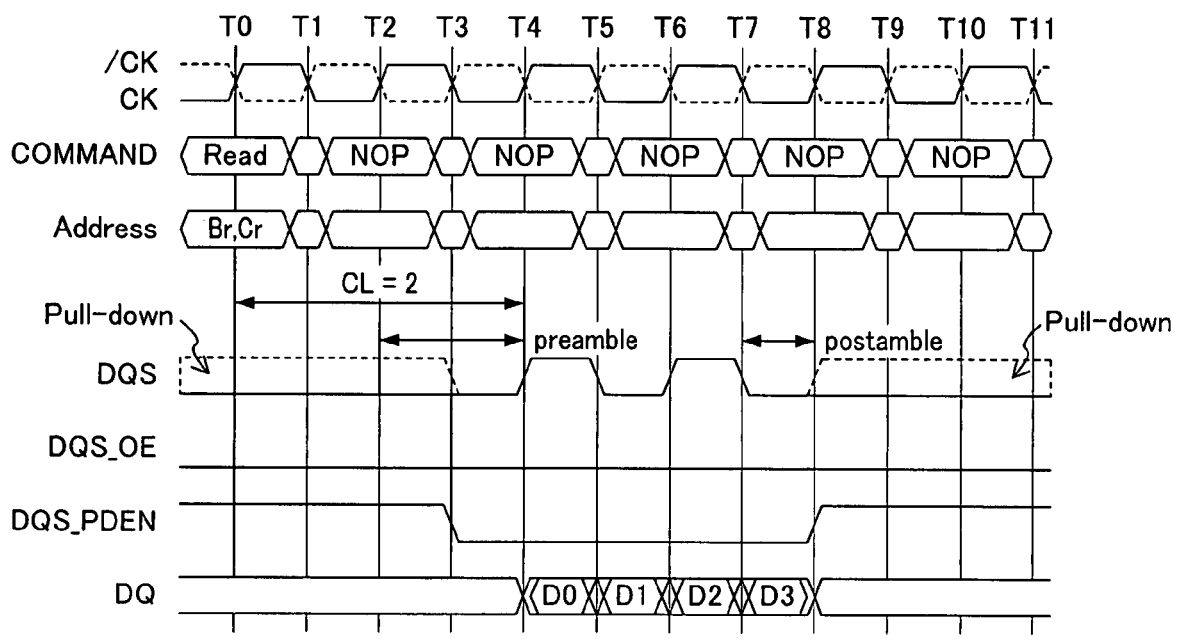
FIG. 3 is a timing chart for describing an operation of the interface circuit during a read process from the external device to the semiconductor device of FIG. 1.

In FIGS. 2 and 3, timing with which pull-down is turned ON/OFF is determined based on the type of the external device 20 or the settings of various parameters of the external device 20. For example, the timing is determined based on the latency, a burst length which defines the number of times of data transfer by a single time of command issuance, or the like.

Therefore, if the timing with which pull-down is turned ON/OFF is uniquely determined based on the type of the external device 20 or the settings of various parameters of the external device 20, pull-down can be appropriately turned ON/OFF, depending on the external device 20 connected to the interface circuit 1.

Also, if the timing with which pull-down is turned ON/OFF can be arbitrarily set based on a register setting or the like with reference to timing which the information processing section 11 issues a write/read command, it is not necessary to previously define the ON/OFF timing based on the type of the external device 20 or the settings of various parameters of the external device 20.

<Effect>

As described above, when the input of the input buffer gate 102 is in the high-impedance state (a signal is not supplied from any of the external device 20 and the information processing section 11), pull-down is ON, so that the potential level at the input of the input buffer gate 102 is stable. Therefore, it is possible to prevent occurrence of noise during the high-impedance state, thereby making it possible to prevent the information processing section 11 of the semiconductor device 10 from erroneously recognizing the "1/0" level. Also, when a signal is supplied from either the external device 20 or the information processing section 11, pull-down is turned OFF, so that signal propagation is not hindered.

Further, as is different from the conventional art, it is not necessary to use a reference voltage so as to determine the "1/0" level, so that a through current does not flow through the input buffer gate 102. Therefore, it is not necessary to use a differential amplification circuit as the input buffer gate 102 (i.e., the input buffer gate 102 can be formed of a circuit other than differential amplification circuits). Thereby, power consumption can be reduced, thereby making it possible to reduce the circuit scale.

Although it has been assumed above that the pull-down resistor RD103 is provided inside the semiconductor device 10, the pull-down resistor RD103 may be provided and controlled outside the semiconductor device 10. In this case, a similar effect can be obtained.

Also, in this embodiment, since the input/output synchronization signal DQS of the external device (DDR SDRAM) 20 is at the "0" level in the preamble and the postamble, the input of the input buffer gate 102 is caused to be at "0" level by pull-down when the input of the input buffer gate is in the high-impedance state. Alternatively, if the input/output synchronization signal DQS of the external device (DDR SDRAM) 20 is at the "1" level in the preamble and the postamble, the input of the input buffer gate 102 may be caused to be at "1" level by pull-up.

Further, if the level of the input/output synchronization signal DQS of the external device (DDR SDRAM) 20 is different between in the preamble and in the postamble, pull-down and pull-up may be controlled, depending on the difference.

Second Embodiment

<Configuration>

Figure 4:
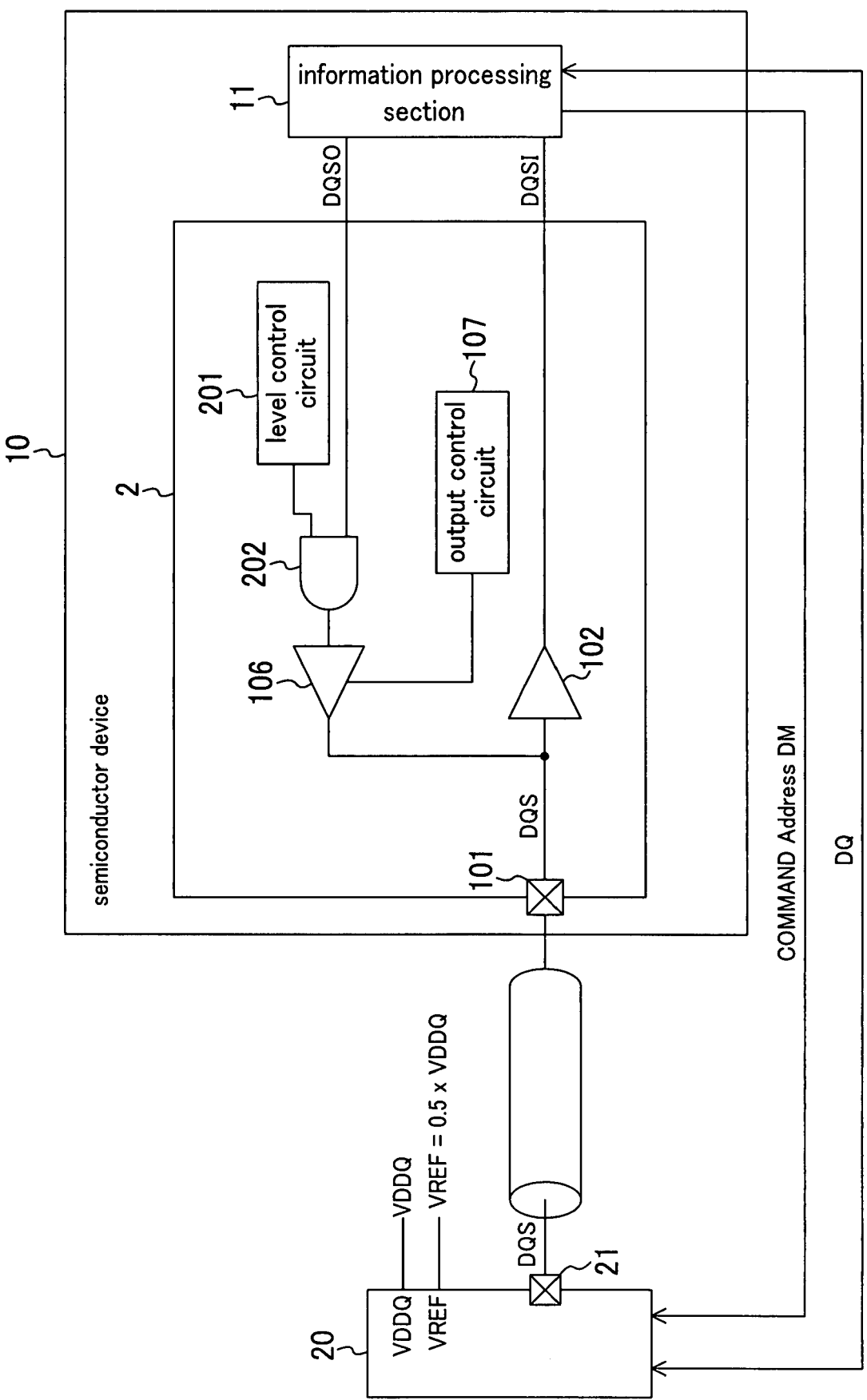
FIG. 4 is a diagram showing a configuration of an interface circuit according to a second embodiment of the present invention.

FIG. 4 shows a configuration of an interface circuit 2 according to a second embodiment of the present invention. The interface circuit 2 comprises a level control circuit 201 and an AND circuit (logic circuit) 202 instead of the pull-down resistor RD103, the switch element 104, and the pull-down control circuit 105 of FIG. 1. The other parts are similar to those of FIG. 1.

The level control circuit 201 outputs a signal having the "0" level or a signal having the "1" level. The AND circuit 202 outputs to the output buffer gate 106 the logical AND of the DQS output DQSO of the information processing section 11 and the output of the level control circuit 201.

<Operation During Write Process>

Figure 5:
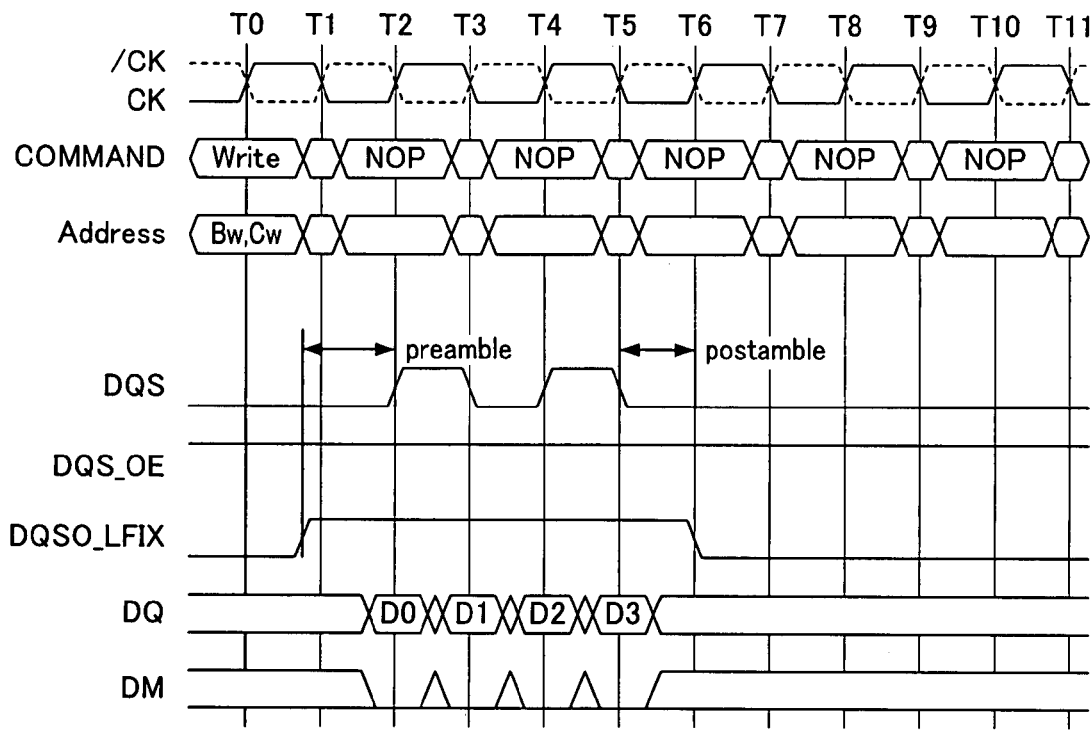
FIG. 5 is a timing chart for describing an operation of the interface circuit during a write process from a semiconductor device to an external device of FIG. 4.

Next, an operation of the interface circuit 2 when data is written from the semiconductor device 10 to the external device 20 will be described with reference to FIG. 5. In FIG. 5, "DQSO_LFIX" indicates an output of the level control circuit 201. Here, the output DQS_OE of the output control circuit 107 remains at the "1" level.

Before cycle T0, since the output DQS_OE of the output control circuit 107 is at the "1" level, the output state of the output buffer gate 106 is the "signal output state". Also, since the output DQSO_LFIX of the level control circuit 201 is at the "0" level, the output of the AND circuit 202 is at the "0" level. Therefore, the input of the output buffer gate 106 is fixed to the "0" level, and the output (input/output synchronization signal DQS) of the output buffer gate 106 is also fixed to the "0" level. Thereby, the potential levels at the inputs of the input/output synchronization signal terminal 101 and the input buffer gate 102 are also fixed to the "0" level.

In cycle T0, the information processing section 11 outputs a write command (Write), a write bank (Bw), and a write address (Cw).

Near cycle T1, the information processing section 11 causes the DQS output DQSO to go to the "0" level (supply of the DQS output DQSO is started). Also, the level control circuit 201 causes its own output DQSO_LFIX to go to the "1" level. Thereby, the level fixation at the output of the output buffer gate 106 is removed, so that the output of the output buffer gate 106 goes to a level which corresponds to the DQS output DQSO from the information processing section 11. Also, the level fixation at the inputs of the input/output synchronization signal terminal 101 and the input buffer gate 102 is also removed, so that the output (input/output synchronization signal DQS) of the output buffer gate 106 is supplied via the input/output synchronization signal terminal 101 to the external device 20.

In cycles T1 to T5, processes similar to those of the first embodiment (FIG. 2) are executed, so that the write process of the semiconductor device 10 is ended.

At the beginning of cycle T6, the information processing section 11 ends outputting of the DQS output DQSO. The level control circuit 201 causes its own output DQSO_LFIX to go to the "0" level. Thereby, the output of the AND circuit 202 goes to the "0" level, and the output (input/output synchronization signal DQS) of the output buffer gate 106 is fixed to the "0" level. Therefore, the potential levels at the inputs of the input/output synchronization signal terminal 101 and the input buffer gate 102 are also fixed to the "0" level.

After cycle T6, the output DQSO_LFIX of the level control circuit 201 remains at the "0" level, so that the input of the input buffer gate 102 is also fixed to the "0" level.

<Operation During Read Operation>

Next, an operation of the interface circuit 2 when data is read from the external device 20 to the semiconductor device 10 of FIG. 4 will be described with reference to FIG. 6. Here, the output DQSO_LFIX of the level control circuit 201 remains at the "0" level.

Before cycle T0, since the output DQS_OE of the output control circuit 107 is at the "1" level, the output state of the output buffer gate 106 is in the "signal output state". Also, since the output DQSO_LFIX of the level control circuit 201 is at the "0" level, the output of the AND circuit 202 is at the "0" level. Thereby, the output (input/output synchronization signal DQS) of the output buffer gate 106 is fixed to the "0" level, and the inputs of the input/output synchronization signal terminal 101 and the input buffer gate 102 are fixed to the "0" level.

In cycle T0, the information processing section 11 outputs a read command (Read), a read bank (Br), and a read address (Cr).

At the beginning of cycle T2 (one cycle before the latency), the external device 20 causes the input/output synchronization signal DQS to go to the "0" level (supply of the input/output synchronization signal DQS is started). Thereby, the output of the output buffer gate 106 goes to the "0" level. Here, since the input of the output buffer gate 106 (the output of the AND circuit 202) is also at the "0" level, no extraordinary load is applied to the output buffer gate 106.

In cycle T3 (preamble period), the output control circuit 107 causes its own output DQS_OE to go to the "0" level and thereby causes the output state of the output buffer gate 106 to go to the "Hi-Z state". Thereby, the level fixation at the inputs of the input/output synchronization signal terminal 101 and the input buffer gate 102 is removed. Therefore, the input/output synchronization signal DQS (here, at the "0" level) from the external device 20 is supplied via the input/output synchronization signal terminal 101 to the input buffer gate 102. Therefore, the input buffer gate 102 supplies the input/output synchronization signal DQS from the external device 20, as a DQS input DQSI (here, at the "0" level), to the information processing section 11.

In cycles T4 to T7, processes similar to those of the first embodiment (FIG. 3) are executed, so that the read process of the semiconductor device 10 is ended.

At the beginning of cycle T8, the external device 20 ends supply of the input/output synchronization signal DQS. The output control circuit 107 causes its own output DQS_OE to go to the "1" level and thereby causes the output state of the output buffer gate 106 to go to the "signal output state". In this case, since the output DQSO_LFIX of the level control circuit 201 is at the "0" level, the potential levels at the inputs of the input/output synchronization signal terminal 101 and the input buffer gate 102 are fixed to the "0" level.

After cycle T8, since the output DQSO_LFIX of the level control circuit 201 remains at the "0" level, the input of the input buffer gate 102 is also fixed to the "0" level.

<Timing of Switching Level Fixation>

Figure 6:
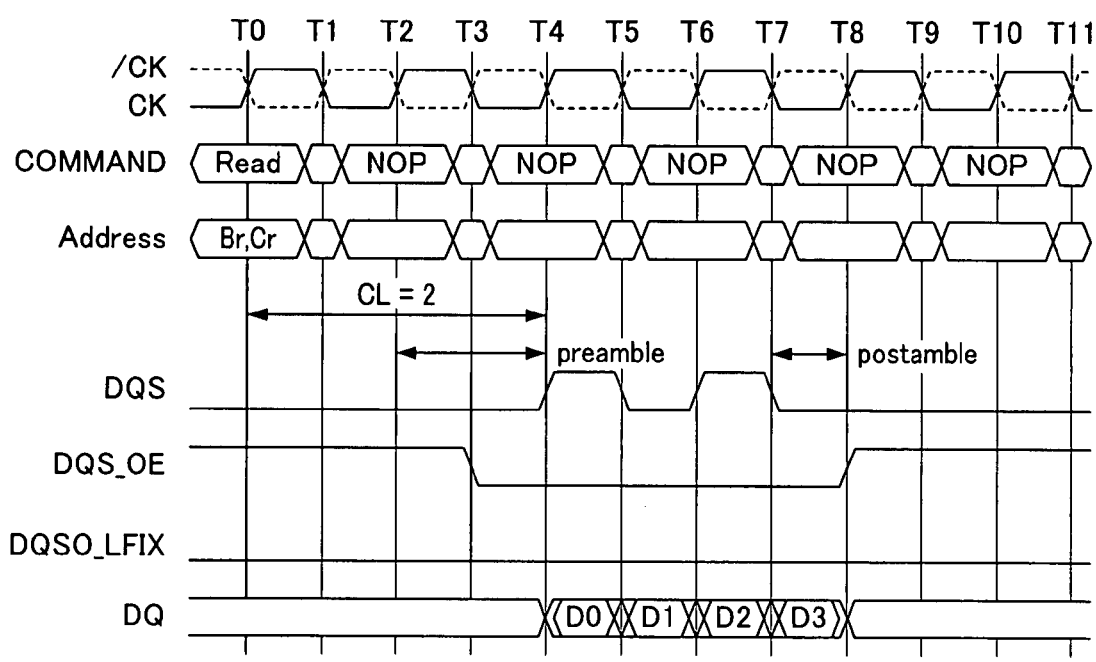
FIG. 6 is a timing chart for describing an operation of the interface circuit during a read process from the external device to the semiconductor device of FIG. 4.

In FIGS. 5 and 6, timing of switching the levels of the output DQS_OE of the output control circuit 107 and timing of switching the levels of the output DQSO_LFIX of the level control circuit 201 are determined based on the type of the external device 20 or the settings of various parameters of the external device 20. For example, the timing is determined based on the latency, a burst length which defines the number of times of data transfer per a single time of command issuance, or the like.

Therefore, if the switching timings of the output DQS_OE and the output DQSO_LFIX are uniquely set based on the type of the external device 20 or the settings of various parameters of the external device 20, the output DQS_OE and output DQSO_LFIX can be appropriately switched, depending on the external device 20 connected to the interface circuit 2.

Also, if the switching timings of the output DQS_OE and the output DQSO_LFIX are arbitrarily set by a register setting or the like with reference to timing with which the information processing section 11 issues a write/read command, it is no longer required to previously define the switching timings of the output DQS_OE and the output DQSO_LFIX based on the type of the external device 20 or the settings of various parameters of the external device 20.

<Effect>

As described above, when the input of the input buffer gate 102 is in the high-impedance state, the output of the output buffer gate 106 is fixed to the "0" level, so that the potential level at the input of the input buffer gate 102 is stable. Therefore, it is possible to prevent occurrence of noise during the high-impedance state, thereby making it possible to prevent erroneous recognition of the "1/0" level. Also, when a signal is supplied from the external device 20, the output state of the output buffer gate 106 goes to the Hi-Z state, and when a signal is supplied from the information processing section 11, the output state of the output buffer gate 106 goes to the signal output state and a signal from the information processing section 11 is supplied to the output buffer gate 106, so that signal propagation is not hindered.

Further, as is different from the conventional art, it is not necessary to use a reference voltage so as to determine the "1/0" level of a small-amplitude signal, so that a through current does not flow through the input buffer gate 102. Therefore, it is not necessary to use a differential amplification circuit as the input buffer gate 102 (i.e., the input buffer gate 102 can be formed of a circuit other than differential amplification circuits). Thereby, power consumption can be reduced, thereby making it possible to reduce the circuit scale.

Although the output buffer gate 106 is used as both a buffer gate for outputting a signal from the information processing section 11 and a buffer gate for fixing the signal to the "0" level, the buffer gates can be separately provided.

Also, in this embodiment, since the input/output synchronization signal DQS of the external device (DDR SDRAM) 20 is at the "0" level in the preamble and the postamble, the input of the input buffer gate 102 is fixed to the "0" level when no valid input/output synchronization signal DQS is present (the input of the input buffer gate 102 is in the high-impedance state). Alternatively, if the input/output synchronization signal DQS of the external device (DDR SDRAM) 20 is at the "1" level in the preamble and the postamble, the input of the input buffer gate 102 may be fixed to the "1" level.

Further, if the level of the input/output synchronization signal DQS of the external device (DDR SDRAM) 20 is different between in the preamble and in the postamble, the level may be controlled, depending on the difference.

Third Embodiment

<Configuration>

Figure 7:
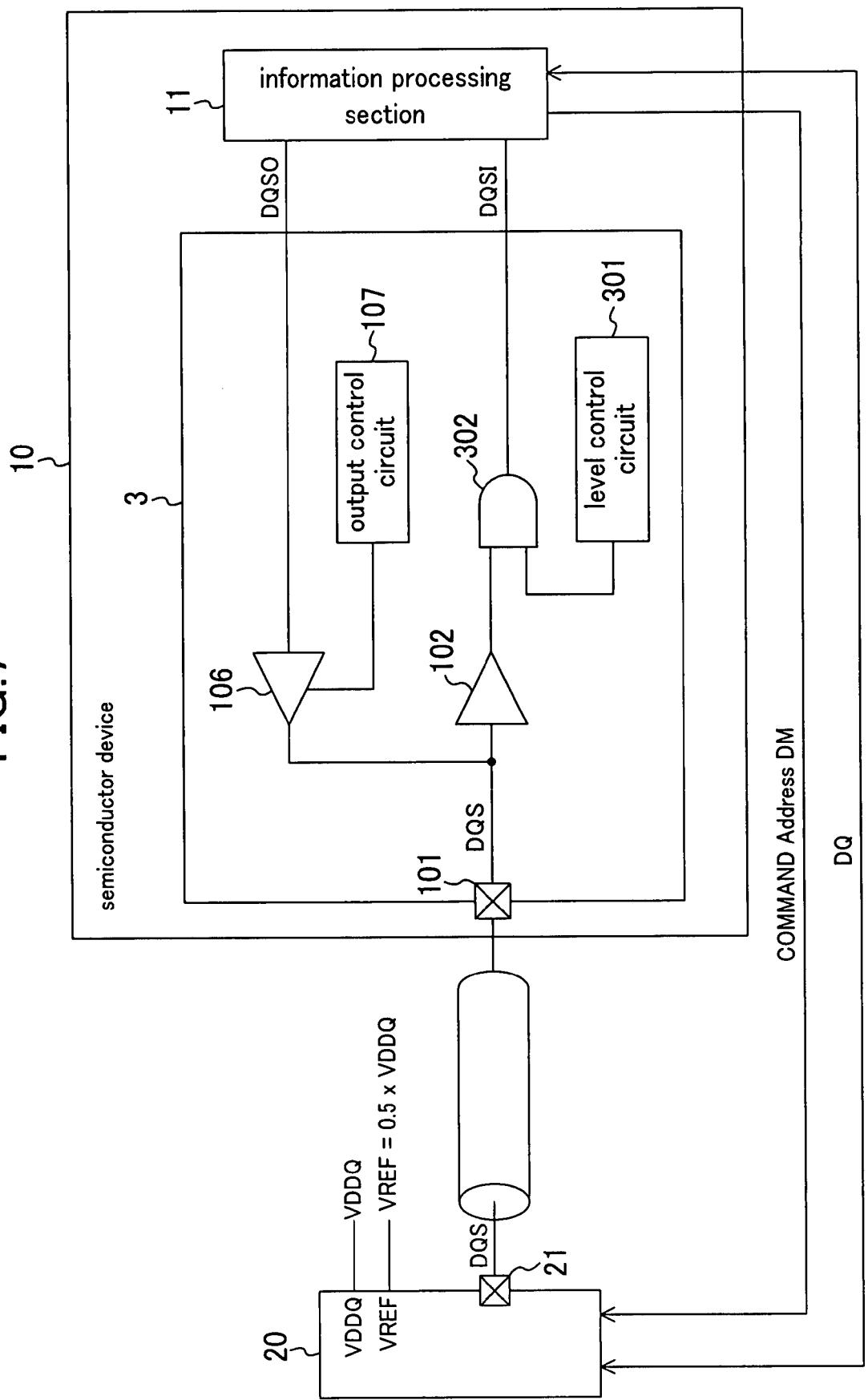
FIG. 7 is a diagram showing a configuration of an interface circuit according to a third embodiment of the present invention.

FIG. 7 shows a configuration according to an interface circuit 3 according to a third embodiment of the present invention. The interface circuit 3 comprises a level control circuit 301 and an AND circuit (logic circuit) 302 instead of the pull-down resistor RD103, switch element 104, and the pull-down control circuit 105 of FIG. 1. The other parts are similar to those of FIG. 1.

The level control circuit 301 outputs a signal having the "0" level or a signal having the "1" level. The AND circuit 302 outputs the logic AND of the output of the input buffer gate 102 and the output of the level control circuit 301, as a DQS input DQSI, to the information processing section 11.

<Operation During Write Process>

Figure 8:
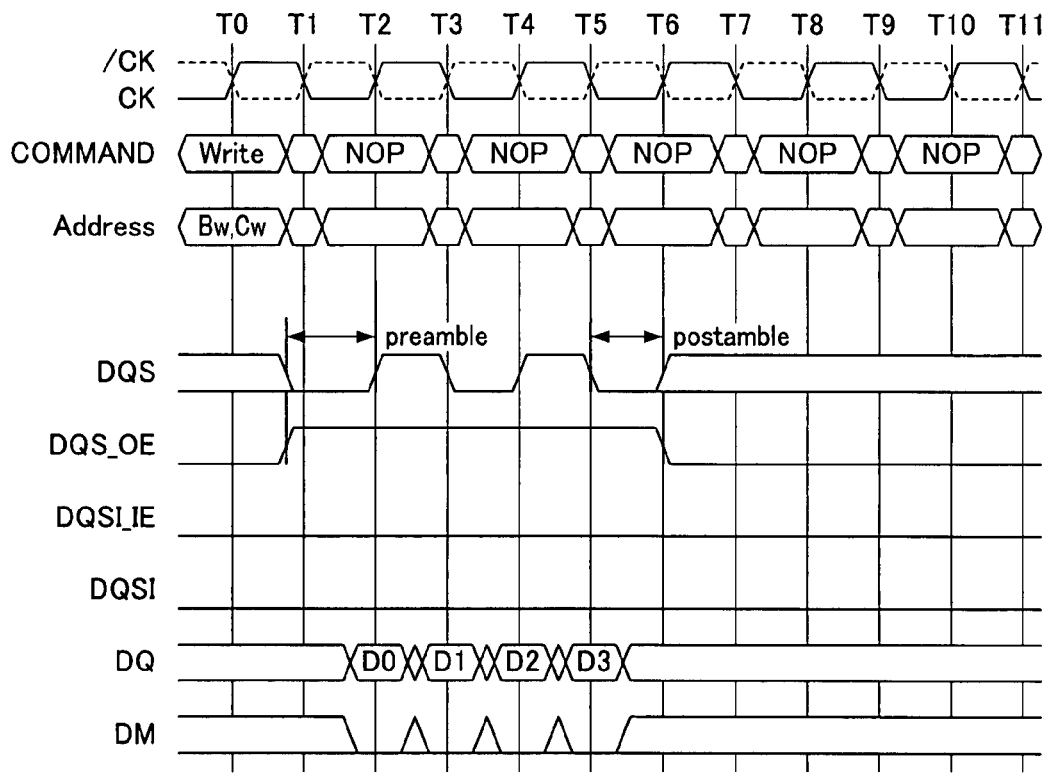
FIG. 8 is a timing chart for describing an operation of the interface circuit during a write process from a semiconductor device to an external device of FIG. 7.

Next, an operation of the interface circuit 3 when data is written from the semiconductor device 10 to the external device 20 of FIG. 7 will be described with reference to FIG. 8. In FIG. 8, "DQSI_IE" indicates an output of the level control circuit 301, and "DQSI" indicates a DQS input which is supplied to the information processing section 11 and is used for a read control. Here, the output DQSI_IE of the level control circuit 301 and the DQS input DQSI remain at the "0" level.

During a data write operation from the semiconductor device 10 to the external device 20, it is not necessary to supply the DQS input DQSI to the information processing section 11, so that the output DQSI_IE of the level control circuit 301 is fixed to the "0" level. Therefore, the output (DQS input DQSI) of the AND circuit 302 is also fixed to the "0" level. Thereby, even if the input of the input buffer gate 102 varies, the output (DQS input DQSI) of the AND circuit 302 does not vary. Note that the other signals are similar to those of FIG. 2.

<Operation During Read Process>

Next, an operation of the interface circuit 3 when data is read from the external device 20 to the semiconductor device 10 of FIG. 7 will be described with reference to FIG. 9. Here, the output DQS_OE of the output control circuit 107 remains at the "0" level.

Before cycle T0, since the output DQS_OE of the output control circuit 107 is at the "0" level (i.e., the output state of the output buffer gate 106 is the "Hi-Z state"), the output of the output buffer gate 106 is at the "0" level. On the other hand, since the output DQSI_IE of the level control circuit 301 is at the "0" level, the output (DQS input DQSI) of the AND circuit 302 is fixed to the "0" level. Therefore, even if the input of the input buffer gate 102 varies, the output (DQS input DQSI) of the AND circuit 302 does not vary, so that an erroneous read control is not executed in the information processing section 11.

In cycle T0, the information processing section 11 outputs a read command (Read), a read bank (Br), and a read address (Cr).

Near cycle T2 (one cycle before the latency), the external device 20 causes the input/output synchronization signal DQS to go to the "0" level (supply of the input/output synchronization signal DQS is started).

In cycle T3 (preamble period), the level control circuit 301 causes its own output DQSI_IE to go to the "1" level and thereby removes the level fixation at the output (DQS input DQSI) of the AND circuit 302. Thereby, the input/output synchronization signal DQS from the external device 20 is supplied via the input/output synchronization signal terminal 101 to the information processing section 11.

In cycles T4 to T7, processes similar to those of the first embodiment (FIG. 3) are executed, so that the read process of the semiconductor device 10 is ended.

At the beginning of cycle T8, the external device 20 ends supply of the input/output synchronization signal DQS. The level control circuit 301 causes its own output DQSI_IE to go to the "0" level and thereby fixes the output (DQS input DQSI) of the AND circuit 302 to the "0" level. Therefore, even if the input of the input buffer gate 102 varies, the output (DQS input DQSI) of the AND circuit 302 does not vary, so that an erroneous read control is not executed in the information processing section 11.

<Switching Timing of Level Fixation>

Figure 9:
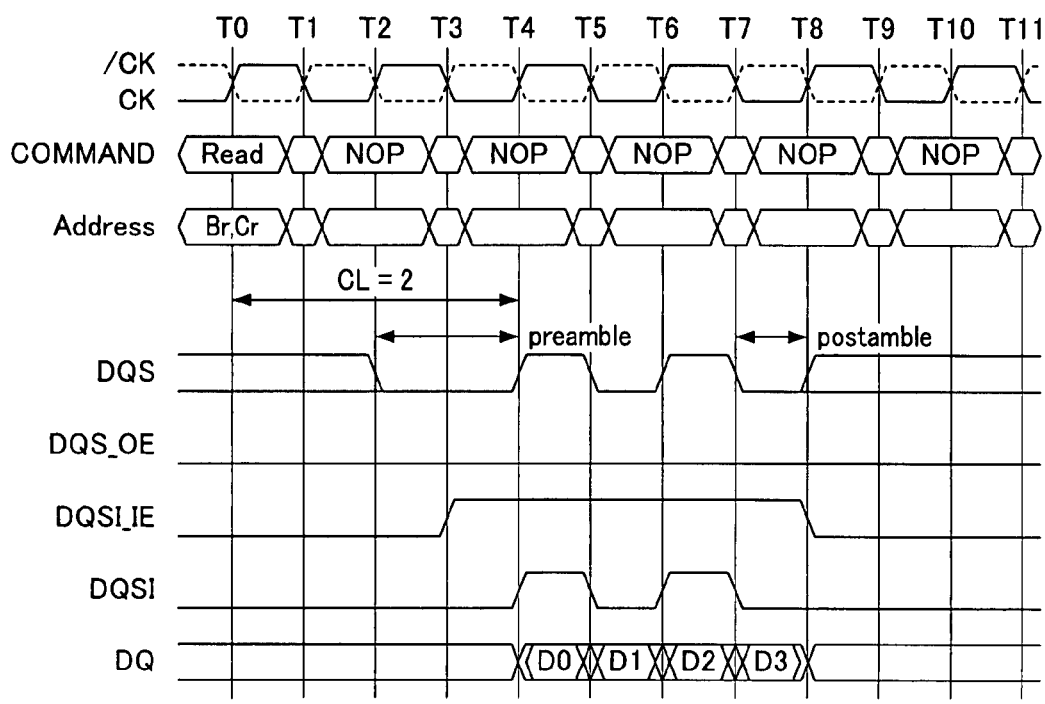
FIG. 9 is a timing chart for describing an operation of the interface circuit during a read process from the external device to the semiconductor device of FIG. 7.

In FIGS. 8 and 9, timing of switching the levels of the output DQSI_IE of the level control circuit 301 is determined based on the type of the external device 20 or the settings of various parameters of the external device 20. For example, the timing is determined based on the latency, a burst length which defines the number of times of data transfer per a single time of command issuance, or the like.

Therefore, if the switching timing of the output DQSI_IE is uniquely set based on the type of the external device 20 or the settings of various parameters of the external device 20, the output DQSI_IE of the level control circuit 301 can be appropriately switched, depending on the external device 20 connected to the interface circuit 3.

Also, if the switching timing of the output DQSI_IE is arbitrarily set by a register setting or the like with reference to timing with which the information processing section 11 issues a write/read command, it is no longer required to previously define the switching timing of the output DQSI_IE based on the type of the external device 20 or the settings of various parameters of the external device 20.

<Effect>

As described above, when the input of the input buffer gate 102 is in the high-impedance state, the potential level at the output of the output buffer gate 106 is fixed, so that the output of the input buffer gate 102 does not vary even if the input of the input buffer gate 102 varies. Therefore, it is possible to prevent erroneous recognition of the "1/0" level. Also, when a signal is supplied from the external device 20, the fixation of the potential level at the output of the input buffer gate 102 is removed, so that signal propagation is not hindered.

Further, as is different from the conventional art, it is not necessary to use a reference voltage so as to determine the "1/0" level of a small-amplitude signal, so that a through current does not flow through the input buffer gate 102. Therefore, it is not necessary to use a differential amplification circuit as the input buffer gate 102 (i.e., the input buffer gate 102 can be formed of a circuit other than differential amplification circuits). Thereby, power consumption can be reduced, thereby making it possible to reduce the circuit scale.

Note that, in this embodiment, since the input/output synchronization signal DQS of the external device (DDR SDRAM) 20 is at the "0" level in the preamble and the postamble, the output (DQS input DQSI) of the input buffer gate 102 is fixed to the "0" level when the input of the input buffer gate 102 is in the high-impedance state. Alternatively, if the input/output synchronization signal DQS of the external device (DDR SDRAM) 20 is at the "1" level in the preamble and the postamble, the output (DQS input DQSI) of the input buffer gate 102 may be fixed to the "1" level.

Also, if the level of the input/output synchronization signal DQS of the external device (DDR SDRAM) 20 is different between in the preamble and in the postamble, the level may be controlled, depending on the difference.

Fourth Embodiment

<Configuration>

Figure 10:
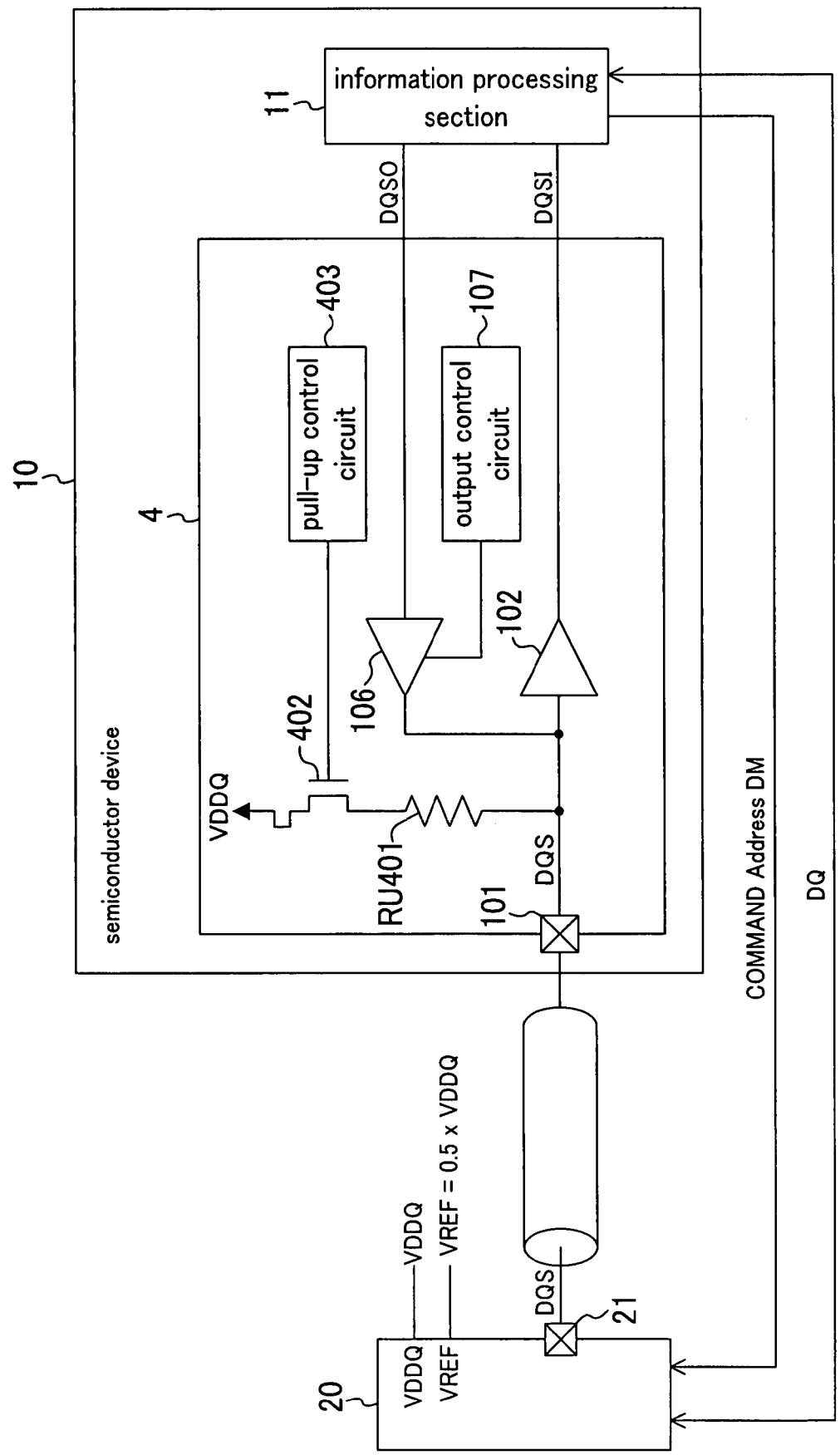
FIG. 10 is a diagram showing a configuration of an interface circuit according to a fourth embodiment of the present invention.

FIG. 10 shows a configuration of an interface circuit 4 according to a fourth embodiment of the present invention. The interface circuit 4 comprises a pull-up resistor RU401, a switch element (transistor) 402, and a pull-up control circuit 403 instead of the pull-down resistor RD103, the switch element 104, and the pull-down control circuit 105 of FIG. 1. The other parts are similar to those of FIG. 1.

The pull-up resistor RU401 and the switch element 402 are connected in series between the input/output synchronization signal terminal 101 and a power supply voltage VDDQ.

The pull-up control circuit 403 controls ON/OFF of the switch element 402 to switch ON/OFF of pull-up. Also, during a read process of the semiconductor device 10, the pull-up control circuit 403 detects the potential level at the input of the input buffer gate 102 and switches ON/OFF of pull-up based on the result of the detection of the potential level.

<Operation During Write Process>

Figure 11:
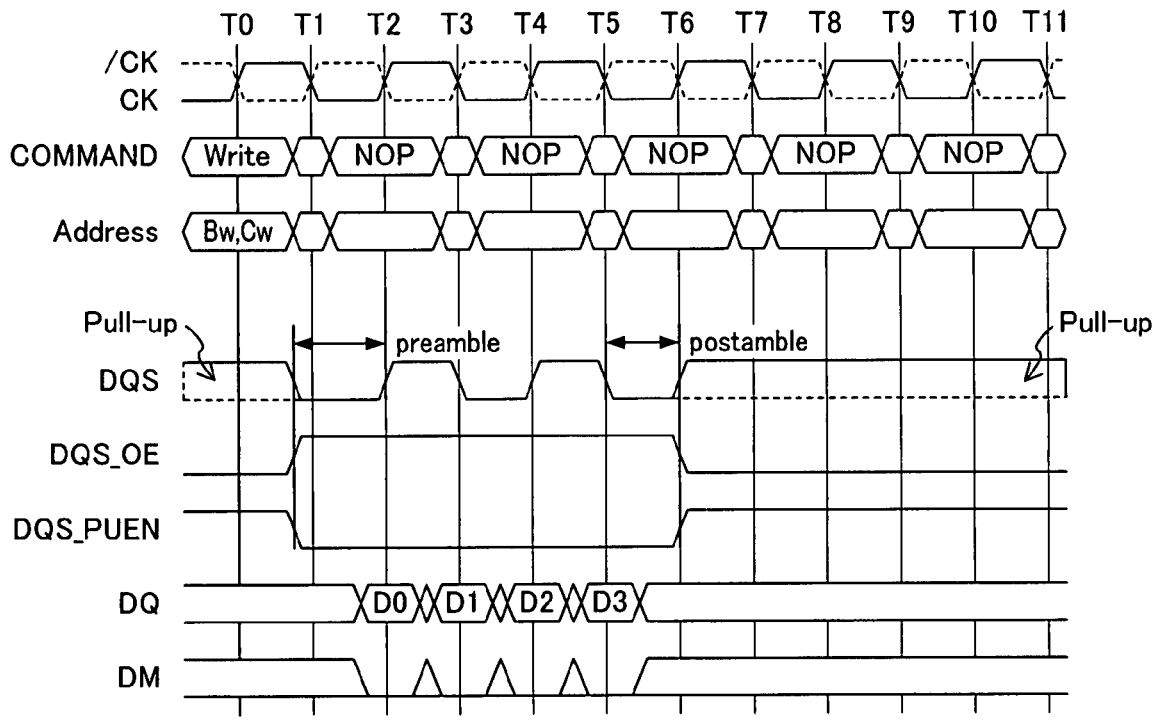
FIG. 11 is a timing chart for describing an operation of the interface circuit during a write process from a semiconductor device to an external device of FIG. 10.

Next, an operation of the interface circuit 4 when data is written from the semiconductor device 10 to the external device 20 of FIG. 10 will be described with reference to FIG. 11. In FIG. 11, "DQS_PUEN" indicates an output of the pull-up control circuit 403.

Before cycle T0, since the output DQS_OE of the output control circuit 107 is at the "0" level, the output state of the output buffer gate 106 is the "Hi-Z state". Also, since the output DQS_PUEN of the pull-up control circuit 403 is at the "1" level, pull-up is ON. Thereby, the potential levels at the inputs of the input/output synchronization signal terminal 101 and the input buffer gate 102 are fixed to the "1" level.

In cycle T0, the information processing section 11 outputs a write command (Write), a write bank (Bw), and a write address (Cw).

Near cycle T1, the information processing section 11 causes the DQS output DQSO to go to the "0" level (supply of the DQS output DQSO is started). Also, the output control circuit 107 causes its own output DQS_OE to go to the "1" level and thereby causes the output state of the output buffer gate 106 to go to the "signal output state". Here, since the DQS output DQSO is at the "0" level, the output buffer gate 106 outputs the input/output synchronization signal DQS having the "0" level. At the same time, the pull-up control circuit 403 causes its own output DQS_PUEN to go to the "0" level and thereby turns pull-up OFF. Thereby, the input/output synchronization signal DQS from the output buffer gate 106 is supplied via the input/output synchronization signal terminal 101 to the external device 20.

In cycles T1 to T5, processes similar to those of the first embodiment (FIG. 2) are executed, so that a write process of the semiconductor device 10 is ended.

At the beginning of cycle T6, the information processing section 11 ends supply of the DQS output DQSO. The output control circuit 107 causes its own output DQS_OE to go to the "0" level and thereby causes the output state of the output buffer gate 106 to go to the "Hi-Z state". At the same time, the pull-up control circuit 403 causes its own output DQS_PUEN to go to the "1" level and thereby turns pull-up ON. Thereby, the potential levels at the inputs of the input/output synchronization signal terminal 101 and the input buffer gate 102 are fixed to the "1" level.

After cycle T6, since pull-up remains ON, the input of the input buffer gate 102 is fixed to the "1" level.

<Operation During Read Process>

Next, an operation of the interface circuit 4 when data is read from the external device 20 to the semiconductor device 10 of FIG. 10 will be described with reference to FIG. 12. Here, the output DQS_OE of the output control circuit 107 remains at the "0" level. Note that the latency is assumed to be "two cycles".

Before cycle T0, since the output DQS_OE of the output control circuit 107 is at the "0" level, the output state of the output buffer gate 106 is the "Hi-Z state". Also, since the output DQS_PUEN of the pull-up control circuit 403 is at the "1" level, pull-up is ON. Thereby, the potential levels at the inputs of the input/output synchronization signal terminal 101 and the input buffer gate 102 are fixed to the "1" level.

In cycle T0, the information processing section 11 outputs a read command (Read), a read bank (Br), and a read address (Cr).

Near cycle T2 (one cycle before the latency), the external device 20 causes the input/output synchronization signal DQS to go to the "0" level (supply of the input/output synchronization signal DQS is started). Here, since pull-up is ON, the input of the input buffer gate 102 goes to the "0" level with a slight delay. The pull-up control circuit 403, when detecting that the input of the input buffer gate 102 goes to the "0" level, causes its own output DQS_PUEN to go to the "0" level and thereby turns pull-up OFF. Specifically, the pull-up control circuit 403 detects whether or not the input buffer gate 102 has received a preamble from the external device 20, and controls ON/OFF of pull-up based on the result of the detection of the preamble. When pull-up is turned OFF, the input/output synchronization signal DQS from the external device 20 is supplied to the input buffer gate 102 without a delay.

In cycles T3 to T7, processes similar to those of the first embodiment (FIG. 2) are executed, so that the read process of the semiconductor device 10 is ended.

In cycle T8, the pull-up control circuit 403 causes its own output DQS_PUEN to go to the "1" level and thereby turns pull-up ON. Thereby, the inputs of the input/output synchronization signal terminal 101 and the input buffer gate 102 are fixed to the "1" level.

After cycle T8, since pull-up remains ON, the input of the input buffer gate 102 is fixed to the "1" level.

<Timing of Pull-up>

Note that timing of turning pull-up OFF during a read process (timing of switching the levels of the output DQS_P-DEN of the output control circuit 107) is controlled based on the presence or absence of detection of a preamble, it is not necessary to individually define the timing based on the type of the external device 20 or the settings of various parameters of the external device 20.

Figure 12:
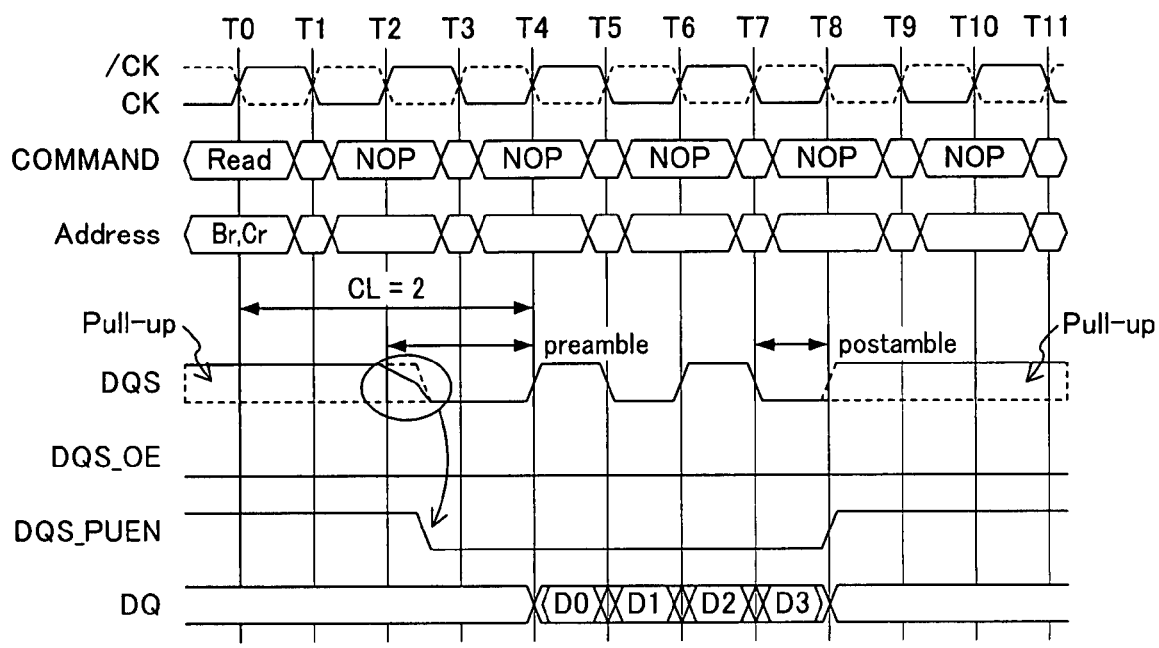
FIG. 12 is a timing chart for describing an operation of the interface circuit during a read process from the external device to the semiconductor device of FIG. 10.
Figure 17:
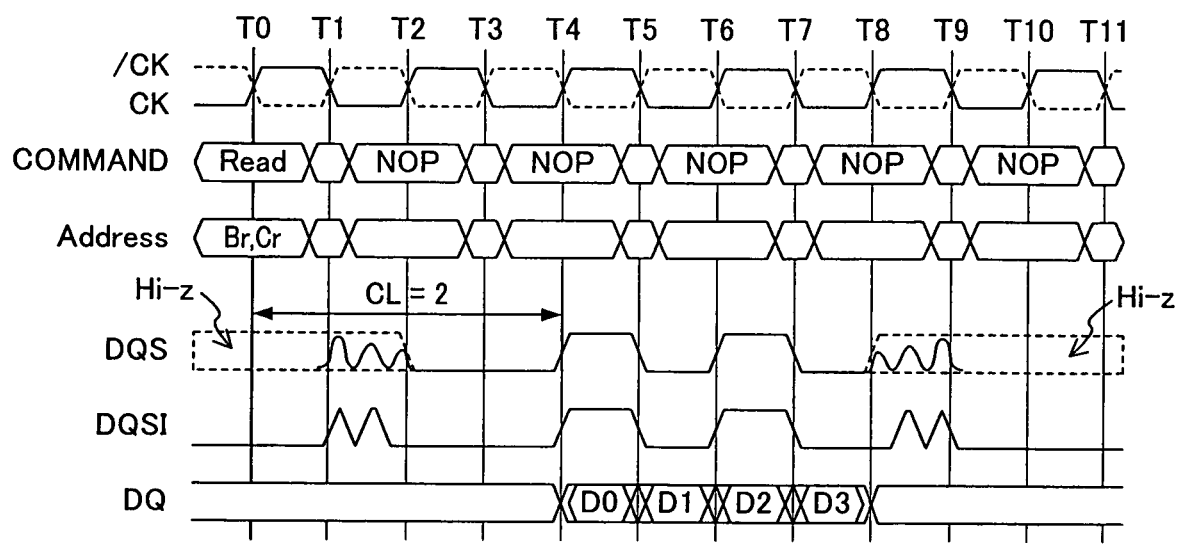
FIG. 17 is a timing chart for describing an operation of the interface circuit of FIG. 16 during a read process from an external device to a semiconductor device in the conventional art.

In FIGS. 11 and 12, pull-up switching timing other than that which is based on the presence or absence of detection of a preamble is determined based on the type of the external device 20 or the settings of various parameters of the external device 20. For example, the timing is determined based on the latency, a burst length which defines the number of times of data transfer per a single time of command issuance, or the like.

Therefore, if the timing of turning pull-up ON/OFF is uniquely set based on the type of the external device 20 or the settings of various parameters of the external device 20, pull-up can be appropriately turned ON/OFF, depending on the external device 20 connected to the interface circuit 4.

Also, if the timing of turning pull-up ON/OFF is arbitrarily set by a register setting or the like with reference to timing with which the information processing section 11 issues a write/read command, it is no longer required to previously define the timing of turning pull-up ON/OFF based on the type of the external device 20 or the settings of various parameters of the external device 20.

<Effect>

As described above, when the input of the input buffer gate 102 is in the high-impedance state, pull-up is ON, so that the potential level at the input of the input buffer gate 102 is stable. Therefore, it is possible to prevent occurrence of noise during the high-impedance state, thereby making it possible to prevent the information processing section 11 of the semiconductor device 10 from erroneously recognizing the "1/0" level. Also, when a signal is supplied from either the external device 20 or the information processing section 11, pull-up is turned OFF, so that signal propagation is not hindered.

Further, as is different from the conventional art, it is not necessary to use a reference voltage so as to determine the "1/0" level, so that a through current does not flow through the input buffer gate 102. Therefore, it is not necessary to use a differential amplification circuit as the input buffer gate 102 (i.e., the input buffer gate 102 can be formed of a circuit other than differential amplification circuits). Thereby, power consumption can be reduced, thereby making it possible to reduce the circuit scale.

Although it has been assumed above that the pull-up resistor RU401 is provided inside the semiconductor device 10, the pull-up resistor RU401 may be provided and controlled outside the semiconductor device 10. In this case, a similar effect can be obtained.

Also, in this embodiment, since the input/output synchronization signal DQS of the external device (DDR SDRAM) 20 is at the "0" level in the preamble and the postamble, the input of the input buffer gate 102 is caused to be at the opposite level ("1" level) by pull-up when the input of the input buffer gate is in the high-impedance state. Alternatively, if the input/output synchronization signal DQS of the external device (DDR SDRAM) 20 is at the "1" level in the preamble and the postamble, the input of the input buffer gate 102 may be caused to be at "0" level by pull-down.

Further, if the level of the input/output synchronization signal DQS of the external device (DDR SDRAM) 20 is different between in the preamble and in the postamble, pull-down and pull-up may be controlled, depending on the difference.

Although it has been assumed in each of the embodiments above that the external device 20 is a "DDR SDRAM", the present invention is not limited to this. The present invention is applicable to an external device having an interface for a small-amplitude signal.

Also, although it has been assumed in each of the embodiments above, for the sake of simplicity, that the present invention is applied only to the input/output synchronization signal DQS, the present invention is also applicable to other bidirectional signals, such as DQ and the like, or an input signal of a semiconductor device.

The interface circuit of the present invention can prevent erroneous recognition of signal determination, and therefore, is useful as a small-amplitude signal interface circuit, such as an SSTL or the like.

What is claimed is:

1. An interface circuit for use in a semiconductor device having a signal output mode in which a signal is supplied to the outside, a signal input mode in which a signal is received from the outside, and a signal no-supply mode in which a signal is not supplied from the outside and a signal is not supplied to the outside, the circuit comprising:

a signal input/output terminal for receiving a signal from the outside in the signal input mode and a signal from the semiconductor device in the signal output mode;

an input buffer gate circuit having an input terminal connected to the signal input/output terminal and for outputting a signal received at the input terminal to the semiconductor device;

an output buffer gate circuit having an input terminal and an output terminal, the output terminal being connected to the signal input/output terminal, and having a signal output state in which a signal received at the input terminal is output, and a high-impedance state in which, even when a signal is received at the input terminal, the signal is not output;

an output control circuit for causing the output buffer gate circuit to go to the signal output state in the signal output mode and in the signal no-supply mode, and the high-impedance state in the signal input mode, a level control circuit for outputting a first level signal in the signal output mode and a second level signal in the signal no-supply mode; and a logic circuit connected between the semiconductor device and the input terminal of the output buffer gate circuit and for outputting a signal having a predetermined potential level to the output buffer gate circuit when the first level signal is output from the level control circuit and a signal from the semiconductor device to the output buffer gate circuit when the second level signal is output from the level control circuit.

2. The interface circuit of claim 1, further comprising:

a resistance circuit having an ON state in which a potential level of the signal input/output terminal is pulled up or down and an OFF state in which the potential level of the signal input/output terminal is not pulled up or down; and a resistance control circuit for causing the resistance circuit to go to the ON state in the signal no-supply mode and the OFF state in the signal output mode and in the signal input mode.

3. The interface circuit of claim 2, wherein timing with which the resistance control circuit causes the resistance circuit to go to the ON state or the OFF state can be changed.

4. The interface circuit of claim 2, wherein timing with which the resistance control circuit causes the resistance circuit to go to the ON state or the OFF state is set, depending on an external device connected to the interface circuit.

5. The interface circuit of claim 1, wherein timing with the output control circuit causes the output buffer gate circuit to go to the signal output state or the high-impedance state and timing with which the level control circuit outputs the first level signal or the second level signal can each be changed.

6. The interface circuit of claim 1, wherein timing with the output control circuit causes the output buffer gate circuit to go to the signal output state or the high-impedance state and timing with which the level control circuit outputs the first level signal or the second level signal are each set, depending on an external device connected to the interface circuit.

7. The interface circuit of claim 1, further comprising:

a resistance circuit having an ON state in which a potential level of the signal input/output terminal is pulled up or down and an OFF state in which the potential level of the signal input/output terminal is not pulled up or down; and a resistance control circuit for causing the resistance circuit to go to the ON state in the signal no-supply mode and the OFF state in the signal output mode, and detects a potential level at the input terminal of the input buffer gate circuit and, depending on a result of the detection of the potential level, causing the resistance circuit to go to the OFF state in the signal input mode.

8. The interface circuit of claim 7, wherein of timing with which the resistance control circuit causes the resistance circuit to go to the ON state or the OFF state, timing other than the timing based on the result of the detection of the potential level can be changed.

9. The interface circuit of claim 7, wherein of timing with which the resistance control circuit causes the resistance circuit to go to the ON state or the OFF state, timing other than the timing based on the result of the detection of the potential level is set, depending on an external device connected to the interface circuit.

10. An interface circuit for use in a semiconductor device having a signal output mode in which a signal is supplied to the outside, a signal input mode in which a signal is received from the outside, and a signal no-supply mode in which a signal is not supplied from the outside and a signal is not supplied to the outside, the circuit comprising:

a signal input/output terminal for receiving a signal from the outside in the signal input mode and a signal from the semiconductor device in the signal output mode;

an input buffer gate circuit having an input terminal connected to the signal input/output terminal and for outputting a signal received at the input terminal to the semiconductor device;

an output level control circuit for fixing a potential level at the output terminal of the input buffer gate circuit to a predetermined level in the signal no-supply mode and removing the fixation of the potential level in the signal input mode;

an output buffer gate circuit having an input terminal and an output terminal, the output terminal being connected to the signal input/output terminal, and having a signal output state in which a signal received at the input terminal is output, and a high-impedance state in which, even when a signal is received at the input terminal, the signal is not output;

an output control circuit for causing the output buffer gate circuit to go to the signal output state in the signal output mode and in the signal no-supply mode, and the high-impedance state in the signal input mode, a level control circuit for outputting a first level signal in the signal output mode and a second level signal in the signal no-supply mode; and a logic circuit connected between the semiconductor device and the input terminal of the output buffer gate circuit and for outputting a signal having a predetermined potential level to the output buffer gate circuit when the first level signal is output from the level control circuit and a signal from the semiconductor device to the output buffer gate circuit when the second level signal is output from the level control circuit.

11. The interface circuit of claim 10, wherein timing with which the level control circuit outputs the first level signal or the second level signal can be changed.

12. The interface circuit of claim 10, wherein timing with which the level control circuit outputs the first level signal or the second level signal is set, depending on an external device connected to the interface circuit.

* * * * *